(12) United States Patent
Tokai

(10) Patent No.: US 10,128,849 B2
(45) Date of Patent: Nov. 13, 2018

(54) LEVEL SHIFT CIRCUIT, SEMICONDUCTOR DEVICE, AND BATTERY SUPERVISORY APPARATUS

(71) Applicant: Kabushiki Kaisha Toshiba, Minato-ku, Tokyo (JP)

(72) Inventor: Yoichi Tokai, Shinagawa Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 281 days.

(21) Appl. No.: 15/228,176

(22) Filed: Aug. 4, 2016

(65) Prior Publication Data

US 2017/0104489 A1 Apr. 13, 2017

(30) Foreign Application Priority Data

Oct. 9, 2015 (JP) .................................. 2015-201317

(51) Int. Cl.
| | |
|---|---|
| *H03K 19/177* | (2006.01) |
| *H02J 7/00* | (2006.01) |
| *H03K 19/0185* | (2006.01) |
| *H03K 3/356* | (2006.01) |

(52) U.S. Cl.
CPC .... *H03K 19/018528* (2013.01); *H02J 7/0063* (2013.01); *H03K 3/356113* (2013.01)

(58) Field of Classification Search
CPC ......... H03K 19/1774; H03K 19/17744; H03K 19/1776; G05B 19/054
USPC ............................ 326/62–78, 81–82; 327/333
See application file for complete search history.

(56) References Cited

U.S. PATENT DOCUMENTS

| | | |
|---|---|---|
| 3,801,831 A | 4/1974 | Dame |
| 4,039,862 A | 8/1977 | Dingwall et al. |
| 4,713,600 A | 12/1987 | Tsugaru et al. |
| 5,528,173 A | 6/1996 | Merritt et al. |
| 5,872,476 A | 2/1999 | Mihara et al. |
| 6,326,839 B2 | 12/2001 | Proebsting |
| 6,593,920 B2 | 7/2003 | Okumura et al. |
| 6,864,718 B2 | 3/2005 | Yu |
| 7,733,126 B1* | 6/2010 | Choy ............. H03K 19/018521 326/68 |
| 9,453,886 B2* | 9/2016 | Makino .............. H03K 17/6871 |
| 9,917,588 B2* | 3/2018 | Blutman ........ H03K 19/018514 |
| 2009/0121789 A1* | 5/2009 | Sanduleanu ............. H03F 3/45 330/253 |

FOREIGN PATENT DOCUMENTS

| | | |
|---|---|---|
| JP | 2001-244803 A | 9/2001 |
| JP | 2007-208919 A | 8/2007 |
| JP | 2013-115601 A | 6/2013 |

\* cited by examiner

*Primary Examiner* — Dylan White

(74) *Attorney, Agent, or Firm* — White & Case LLP

(57) ABSTRACT

According to one embodiment, a level shift circuit includes a first transistor, a second transistor, third transistor, fourth transistor, fifth transistor, sixth transistor, seventh transistor and eighth transistor. The level shift circuit also includes a first capacitance element, a second capacitance element, third capacitance element and fourth capacitance element. The first through eighth transistors have a first conductivity type. The first through fourth transistors are included to a bi-stable multi-vibrator. The fifth through the eighth transistors are included to an active load for the differential input of the signal through the third capacitance element and the fourth capacitance element.

12 Claims, 9 Drawing Sheets

LEVEL SHIFT CIRCUIT, SEMICONDUCTOR DEVICE, AND BATTERY SUPERVISORY APPARATUS

CROSS-REFERENCE TO RELATED APPLICATIONS

This application is based upon and claims the benefit of priority from Japanese Patent Application No. 2015-201317, filed on Oct. 9, 2015; the entire contents of which are incorporated herein by reference.

FIELD

Embodiments described herein relate to a level shift circuit, a semiconductor device, and a supervisory apparatus.

BACKGROUND

A single level shift circuit can be used for conversion by switching to a plurality of voltage levels.

DETAILED DESCRIPTION

Figure 1:
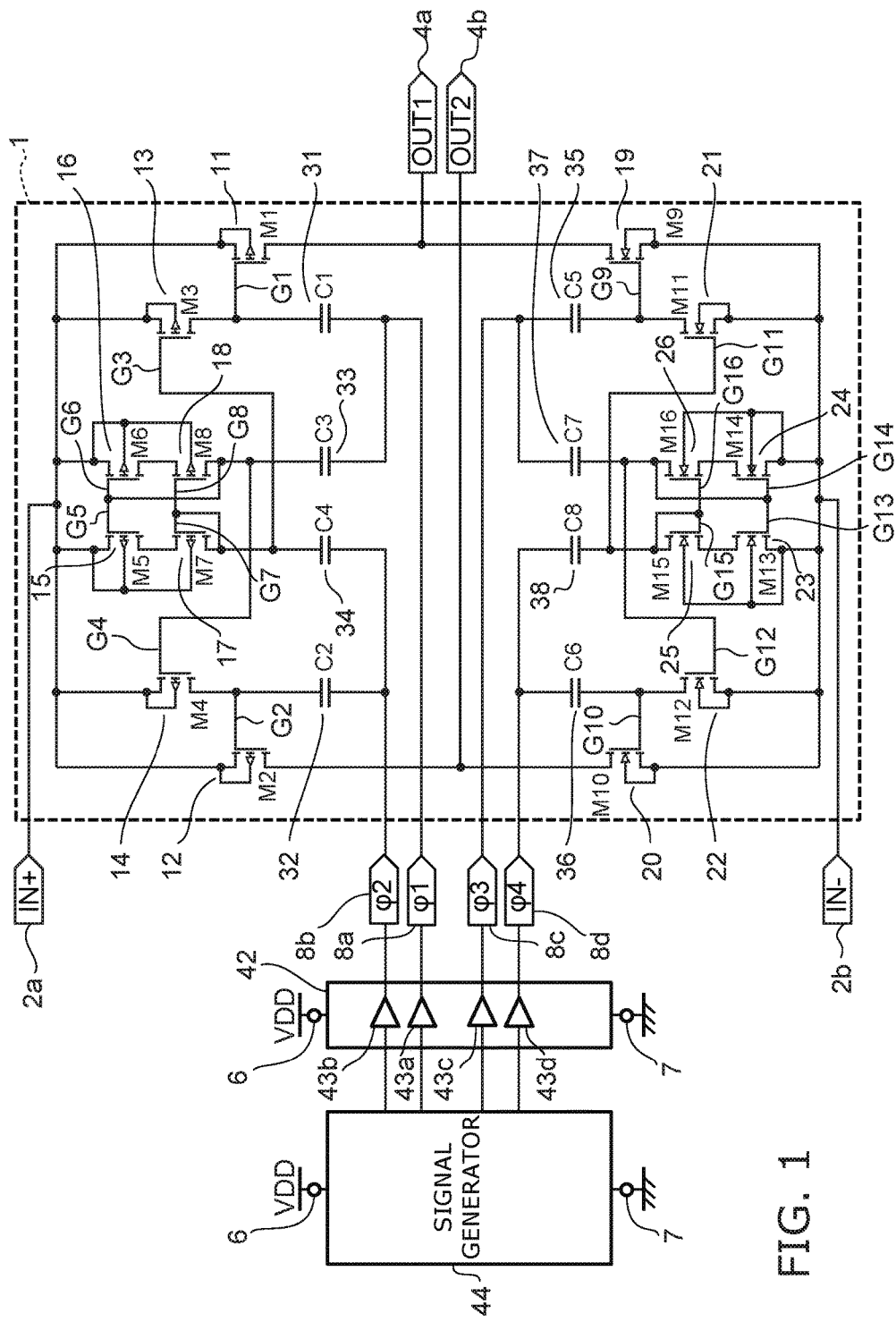
FIG. 1 is a circuit diagram illustrating a level shift circuit according to a first embodiment.

According to an embodiment, a level shift circuit includes a first transistor, a second transistor, third transistor, fourth transistor, fifth transistor, sixth transistor, seventh transistor and eighth transistor. The level shift circuit also includes a first capacitance element, a second capacitance element, third capacitance element and fourth capacitance element. The first through eighth transistors have a first conductivity type. The first transistor is connected by one main electrode to a first input terminal inputted a first input potential and connected by another main electrode to a first output terminal. The second transistor is connected by one main electrode to the first input terminal and connected by another main electrode to a second output terminal. The third transistor is connected by one main electrode to the first input terminal and connected by another main electrode to a first control electrode that is a control electrode of the first transistor. The fourth transistor is connected by one main electrode to the first input terminal and connected by another main electrode to a second control electrode that is a control electrode of the second transistor. The fifth transistor is connected by one main electrode to the first input terminal. The sixth transistor includes a sixth control electrode connected to a fifth control electrode that is a control electrode of the fifth transistor. The sixth transistor is connected to one of a third control electrode that is a control electrode of the third transistor and a fourth control electrode that is a control electrode of the fourth transistor. The sixth transistor is connected by one main electrode to the first input terminal. The seventh transistor is connected by one main electrode to the other main electrode of the fifth transistor. The seventh transistor is connected by another main electrode to the third control electrode. The eighth transistor includes an eighth control electrode connected to a seventh control electrode that is a control electrode of the seventh transistor. The eighth transistor is connected to another of the third control electrode and the fourth control electrode. The eighth transistor is connected by one main electrode to another main electrode of the sixth transistor. The eighth transistor is connected by another main electrode to the fourth control electrode. The first capacitance element is connected by one electrode to a first signal input terminal. The first capacitance element is connected by another electrode to the first control electrode. The second capacitance element is connected by one electrode to a second signal input terminal. The second capacitance element is connected by another electrode to the second control electrode. The third capacitance element is connected by one electrode to the first signal input terminal. The third capacitance element is connected by another electrode to the fourth control electrode. The fourth capacitance element is connected by one electrode to the second signal input terminal. The fourth capacitance element is connected by another electrode to the third control electrode.

Embodiments of the invention will be described below with reference to the drawings.

The drawings are schematically and conceptually drawn, and the relationship between the thickness and the width of each portion, the size ratio between portions, and other factors are therefore not necessarily equal to actual ones. Further, when the same portion is drawn in two or more figures, dimensions and ratios in a figure may differ from those in another figure.

In the specification and drawings, the same element as that having been described with reference to a figure having been referred to has the same reference character and will not be described in detail as appropriate.

First Embodiment

FIG. 1 is a circuit diagram illustrating a level shift circuit according to this embodiment.

Figure 2:
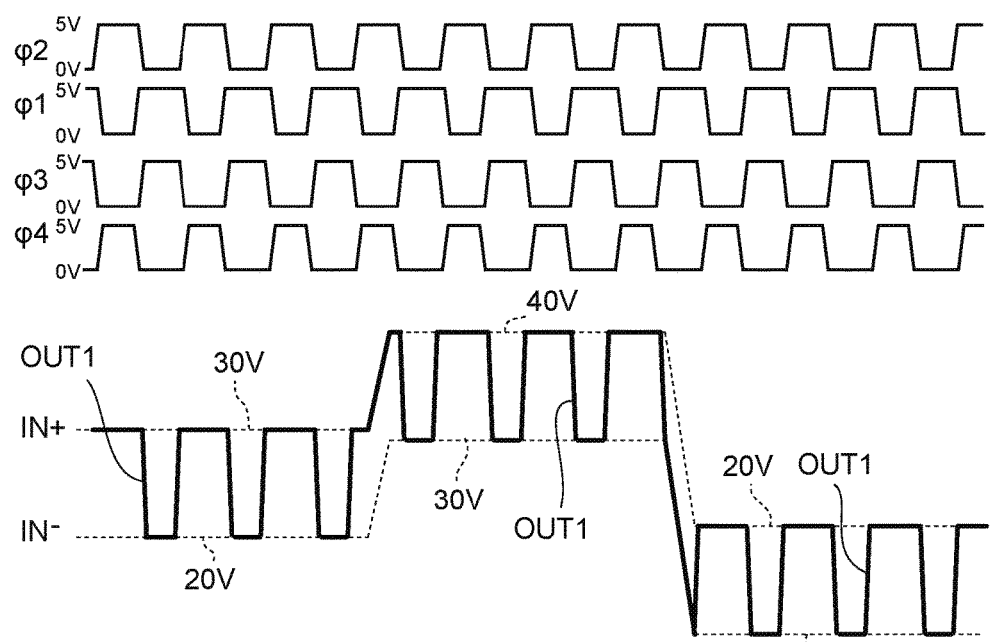
FIG. 2 shows an example of an input signal inputted to the level shift circuit and an output signal outputted from the level shift circuit according to the first embodiment.

FIG. 2 shows an example of an input signal inputted to the level shift circuit and an output signal outputted from the level shift circuit according to this embodiment.

As shown in FIG. 1, the level shift circuit 1 of this embodiment includes first to eighth MOS transistors 11-18 and first to fourth capacitance elements 31-34. The level shift circuit 1 further includes ninth to sixteenth MOS transistors 19-26 and fifth to eighth capacitance elements 35-38. The level shift circuit 1 includes a high potential input terminal 2a and a low potential input terminal 2b. The high potential input terminal 2a is applied a voltage IN+. The low potential input terminal 2b is applied a voltage IN−. The voltage IN+ is higher than the voltage IN−. The level shift circuit 1 includes signal input terminals 8a-8d. In this example, signals φ1-φ4 are generated by a signal generator 44. The signals 41-44 are supplied to the level shift circuit 1 through a buffer circuit 42. The buffer circuit 42 includes buffers 43a-43d corresponding to the respective signals. The signal generator 44 and the buffer circuit 42 are connected between a power supply terminal 6 and a ground terminal 7. The power supply terminal 6 is connected to a power supply VDD. The level shift circuit 1 includes output terminals 4a, 4b. The level shift circuit 1 receives input of signals φ1-φ4 at the signal input terminals 8a-8d. The level shift circuit 1 converts the input signal to a voltage level applied between the high potential input terminal 2a and the low potential input terminal 2b. The level shift circuit 1 outputs the voltage level as a differential output to the first output terminal 4a and the second output terminal 4b. The output of the level shift circuit 1 may be outputted in a single-ended manner to one of the first output terminal 4a and the second output terminal 4b.

In the level shift circuit 1 of this embodiment, for instance, the high potential input terminal 2a is applied 30 V, and the low potential input terminal 2b is applied 20 V.

Rectangular wave signals varying 0-5 V are inputted to the signal input terminals 8a-8d. The level shift circuit 1 converts the rectangular wave signal varying between 0 V and 5 V to a rectangular wave signal varying between 20 V and 30 V for output to the output terminals 4a, 4b. The signal outputted from the output terminals 4a, 4b is a differential output signal.

In the level shift circuit 1 of this embodiment, the voltage IN+ applied to the high potential input terminal 2a only needs to be higher than the voltage IN− applied to the low potential input terminal 2b. The voltage IN+ may be varied dynamically or statically. For instance, as shown in FIG. 2, during input of signals φ1-φ4 varying between 0 V and 5 V, 30 V is applied to the high potential input terminal 2a, and 20 V is applied to the low potential input terminal 2b. Then, the voltage applied to the high potential input terminal 2a may be varied to 40 V, and the voltage inputted to the low potential input terminal 2b may be varied to 30 V. The voltage applied to the high potential input terminal 2a and the low potential input terminal 2b may be varied not only in the increasing direction, but also in the decreasing direction. For instance, the voltage applied to the high potential input terminal 2a may be varied from 40 V to 20 V, and the voltage applied to the low potential input terminal 2b may be varied from 30 V to 10 V. In FIG. 2, the waveform of the output signal OUT2 outputted from the output terminal 4b is not shown to avoid complexity. As described above, the output signals OUT1, OUT2 are configured to the differential output. The output signal OUT2 is nearly equal to the inverse of the output signal OUT1.

In the case where the first to eighth MOS transistors 11-18 are p-channel MOS transistors, the ninth to sixteenth MOS transistors 19-26 are n-channel MOS transistors.

In the following description, an on-state of a p-channel MOS transistor is defined as follows. If a voltage less than or equal to the threshold voltage is applied between the gate and the source of the MOS transistor, the MOS transistor conducts between the drain and the source. Accordingly, a current more than or equal to a prescribed value can be passed therebetween. The on-state of a p-channel MOS transistor includes both the cases of operating in the linear region and the saturated region. An off-state of a p-channel MOS transistor is defined as follows. if a voltage higher than the threshold voltage is applied between the gate and the source of the MOS transistor, the current flowing between the drain and the source is less than or equal to a prescribed leakage current.

An on-state of an n-channel MOS transistor is defined as follows, if a voltage more than or equal to the threshold voltage is applied between the gate and the source of the MOS transistor, the MOS transistor conducts between the drain and the source. Accordingly, a current more than or equal to a prescribed value can be passed therebetween. The on-state of an n-channel MOS transistor includes both the cases of operating in the linear region and the saturated region. An off-state of an n-channel MOS transistor is defined as follows. if a voltage lower than the threshold voltage is applied between the gate and the source of the MOS transistor, the current flowing between the drain and the source is less than or equal to a prescribed leakage current.

First, the configuration including the p-channel MOS transistors (first to eighth MOS transistors 11-18) is described.

The first MOS transistor 11 is connected between the high potential input terminal 2a and the first output terminal 4a by main electrodes. The main electrodes include a source electrode S1 and a drain electrode D1. The source electrode S1 is connected to the high potential input terminal 2a. The drain electrode D1 is connected to the first output terminal 4a. When turned on, the first MOS transistor 11 outputs the voltage IN+ applied to the high potential input terminal 2a to the first output terminal 4a.

The second MOS transistor 12 is connected between the high potential input terminal 2a and the second output terminal 4b by main electrodes. The main electrodes include a source electrode S2 and a drain electrode D2. The source electrode S2 is connected to the high potential input terminal 2a. The drain electrode D2 is connected to the second output terminal 4b. When turned on, the second MOS transistor 12 outputs the voltage IN+ applied to the high potential input terminal 2a to the second output terminal 4b.

The third MOS transistor 13 is connected between the high potential input terminal 2a and the gate electrode G1 of the first MOS transistor 11 by main electrodes. The main electrodes include a source electrode 53 and a drain electrode D3. The source electrode S3 is connected to the high potential input terminal 2a. The drain electrode D3 is connected to the gate electrode G1 of the first MOS transistor 11. By being turned on, the third MOS transistor 13 short-circuits between the gate and the source of the first MOS transistor 11 to turn off the first MOS transistor 11.

The fourth MOS transistor 14 is connected between the high potential input terminal 2a and the gate electrode G2 of the second MOS transistor 12 by main electrodes. The main electrodes include a source electrode S4 and a drain electrode D4. The source electrode S4 is connected to the high potential input terminal 2a. The drain electrode D4 is connected to the gate electrode G2 of the second MOS transistor 12. By being turned on, the fourth MOS transistor 14 short-circuits between the gate and the source of the second MOS transistor 12 to turn off the second MOS transistor 12.

The fifth MOS transistor 15 is connected between the high potential input terminal 2a and the gate electrode G3 of the third MOS transistor 13 by main electrodes. The main electrodes include a source electrode S5 and a drain electrode D5. The source electrode S5 is connected to the high potential input terminal 2a. The drain electrode D5 is connected to the gate electrode G3 of the third MOS transistor 13 through the seventh MOS transistor 17.

The sixth MOS transistor 16 is connected between the high potential input terminal 2a and the gate electrode G4 of the fourth MOS transistor 14 by main electrodes. The main electrodes include a source electrode S6 and a drain electrode D6. The source electrode S6 is connected to the high potential input terminal 2a. The drain electrode D6 is connected to the gate electrode G4 of the fourth MOS transistor 14 through the eighth MOS transistor 18. The gate electrode G6 of the sixth MOS transistor 16 is connected to the gate electrode G5 of the fifth MOS transistor 15.

The seventh MOS transistor 17 is connected between the fifth MOS transistor 15 and the gate electrode G3 of the third MOS transistor 13 by main electrodes. The main electrodes include a source electrode S7 and a drain electrode D7. The source electrode 57 is connected to the drain electrode D5 of the fifth MOS transistor 15. The drain electrode D7 is connected to the gate electrode G3 of the third MOS transistor 13.

The eighth MOS transistor 18 is connected between the sixth MOS transistor 16 and the gate electrode G4 of the fourth MOS transistor 14 by main electrodes. The main electrodes include a source electrode 58 and a drain electrode D8. The source electrode S8 is connected to the drain electrode D6 of the sixth MOS transistor 16. The drain electrode D8 is connected to the gate electrode G4 of the fourth MOS transistor 14. The gate electrode G8 of the eighth MOS transistor 18 is connected to the gate electrode G7 of the seventh MOS transistor 17.

The gate electrode G5 of the fifth MOS transistor 15 and the gate electrode G6 of the sixth MOS transistor 16 connected to each other are connected to the gate electrode G4 of the fourth MOS transistor 14. The gate electrode G7 of the seventh MOS transistor 17 and the gate electrode G8 of the eighth MOS transistor 18 connected to each other are connected to the gate electrode G3 of the third MOS transistor 13. The gate electrode G5 and the gate electrode G6 may be connected to the gate electrode G3. In this case, the gate electrode G7 and the gate electrode G8 are connected to the gate electrode G4.

The fifth MOS transistor 15 and the sixth MOS transistor 16 preferably have an equal transistor size. The transistor size is represented by W/L, where W denotes the gate width, and L denotes the gate length. The fifth MOS transistor 15 and the sixth MOS transistor 16 constitute a current mirror circuit. A current having the same magnitude as the current flowing in the sixth MOS transistor 16 flows in the fifth MOS transistor 15.

The seventh MOS transistor 17 and the eighth MOS transistor 18 preferably have an equal transistor size. The seventh MOS transistor 17 and the eighth MOS transistor 18 have the same transistor size as the fifth MOS transistor 15 and the sixth MOS transistor 16. The seventh MOS transistor 17 and the eighth MOS transistor 18 constitute a current mirror circuit. A current having the same magnitude as the current flowing in the seventh MOS transistor 17 flows in the eighth MOS transistor 18.

The first capacitance element 31 is connected between the signal input terminal 8a and the gate electrode G1 of the first MOS transistor 11.

The second capacitance element 32 is connected between the signal input terminal 8b and the gate electrode G2 of the second MOS transistor 12.

The third capacitance element 33 is connected between the signal input terminal 8a and the gate electrode G4 of the fourth MOS transistor 14.

The fourth capacitance element 34 is connected between the signal input terminal 8b and the gate electrode G3 of the third MOS transistor 13.

The first to fourth capacitance elements 31-34 are capacitors such as ceramic capacitors and film capacitors. The first to fourth capacitance elements 31-34 may be capacitance elements integrated on a silicon or other semiconductor substrate. The DC component of the voltage applied to the first to fourth capacitance elements 31-34 is nearly equal to the difference between the voltage IN+ applied to the high potential input terminal 2a and the H level voltage of the signal φ1, φ2. The first to fourth capacitance elements 31-34 cut the DC component of the signal φ1, φ2 inputted to the signal input terminal 8a, 8b and supply the AC component to the first MOS transistor 11 or the like. Thus, the first to fourth capacitance elements 31-34 have a capacitance value depending on the breakdown voltage more than or equal to the voltage IN+ and the frequency of the input signal supplied to the level shift circuit 1.

The voltage of the DC component applied across the first to fourth capacitance elements 31-34 is the difference between the voltage IN+ and the H level voltage of the signal φ1, φ2. Thus, when the signal φ1, φ2 reaches H level, the gate-source voltage of the first to fourth MOS transistors 11-14 becomes nearly 0 V. Accordingly, the first to fourth MOS transistors 11-14 are turned off. When the signal φ1, φ2 reaches L level, the gate-source voltage applied to the first to fourth MOS transistors 11-14 is the voltage difference between the voltage IN+ and the voltage amplitude of the signal φ1, φ2. Accordingly, the first to fourth MOS transistors 11-14 are turned on.

The circuit portion including the first to fourth MOS transistors 11-14 is a bistable multivibrator. When the signal φ1 reaches L level, the first MOS transistor 11 and the fourth MOS transistor 14 are turned on nearly simultaneously. By turn-on of the fourth MOS transistor 14, the second MOS transistor 12 is turned off. Subsequently, when the signal φ2 (complementary input signal) reaches L level, the second MOS transistor 12 and the third MOS transistor 13 are turned on. By turn-on of the third MOS transistor 13, the first MOS transistor 11 is turned off.

Thus, the first MOS transistor 11 and the second MOS transistor 12 are alternately turned on/off in accordance with the signal φ1, φ2. As described later, a load circuit is connected between each of the output terminals 4a, 4b and the low potential input terminal 2b. The low potential input terminal 2b is applied the voltage IN−. When the signal φ1 is H level, the first MOS transistor 11 is turned off. Thus, the voltage IN− is outputted to the output terminal 4a (out-of-phase output with respect to the signal φ1). On the other hand, the signal φ2 operates complementarily to the signal φ1. Thus, when the signal φ2 is L level, the first MOS transistor 11 is off. Accordingly, the voltage IN− is outputted to the output terminal 4a (in-phase output with respect to the signal φ2). Likewise, when the signal φ2 is L level (the signal φ1 is H level), the first MOS transistor 11 is on. Thus, the voltage IN+ is outputted to the output terminal 4a. That is, H level and L level of the signal φ1, φ2 are level-shifted to the output of the voltage IN+ and the voltage IN−.

The fifth to eighth MOS transistors 15-18 constitute a current mirror circuit. The fifth to eighth MOS transistors 15-18 operate as an active load for the differential input of the signal φ1, φ2 through the third capacitance element 33 and the fourth capacitance element. The fifth to eighth MOS transistors 15-18 prevent the third MOS transistor 13 and the fourth MOS transistor 14 from failing to be turned off when the increase of the voltage applied to the high potential input terminal 2a results in the increase of the voltage applied between the gate and the source of the third MOS transistor 13 and the fourth MOS transistor 14. Specifically, the fifth to eighth MOS transistors 15-18 detect that the increase of the voltage applied to the high potential input terminal 2a has resulted in the increase of the voltage applied between the gate and the source of the third MOS transistor 13 and the fourth MOS transistor 14. Then, the fifth to eighth MOS transistors 15-18 charge the fourth capacitance element 34 and the third capacitance element 33 with charge corresponding to the increased amount of the voltage applied to the high potential input terminal 2a. The fifth to eighth MOS transistors 15-18 detect that the gate-source voltage of the third MOS transistor 13 or the fourth MOS transistor 14 has reached an appropriate value. Then, the fifth to eighth MOS transistors 15-18 stop charging the fourth capacitance element 34 and the third capacitance element 33.

A load circuit constituting a load for the first MOS transistor 11 is connected between the first MOS transistor 11 and the low potential input terminal 2b. Furthermore, a load circuit constituting a load for the second MOS transistor 12 is connected also between the second MOS transistor 12 and the low potential input terminal 2b. These load circuits may be based on e.g. a resistance element or a constant current circuit. Alternatively, a circuit including a MOS transistor can be used as an active load circuit. The level shift circuit 1 of this embodiment uses a circuit complementary to the first to eighth MOS transistors 11-18 and the first to fourth capacitance elements 31-34 described above. Use of a complementary circuit as a load circuit increases the driving performance on the output side. This appropriately ensures the dynamic range on the output side and enables fast operation.

Next, the configuration including the n-channel MOS transistors (ninth to sixteenth MOS transistors 19-26) is described.

The ninth MOS transistor 19 is connected between the output terminal 4a and the low potential input terminal 2b by main electrodes. The main electrodes include a drain electrode D9 and a source electrode S9. The drain electrode D9 is connected to the output terminal 4a and the drain electrode D1 of the first MOS transistor 11. The source electrode S9 is connected to the low potential input terminal 2b. The ninth MOS transistor 19 operates complementarily to the first MOS transistor 11. That is, when the ninth MOS transistor 19 is turned on, the first MOS transistor 11 is turned off. When the ninth MOS transistor 19 is turned off, the first MOS transistor 11 is turned on. Thus, when turned on, the ninth MOS transistor 19 outputs the voltage IN− applied to the low potential input terminal 2b. When turned off, the ninth MOS transistor 19 outputs the voltage IN+ applied to the high potential input terminal 2a.

The tenth MOS transistor 20 is connected between the output terminal 4b and the low potential input terminal 2b by main electrodes. The main electrodes include a drain electrode D10 and a source electrode S10. The drain electrode D10 is connected to the second output terminal 4b and the drain electrode D2 of the second MOS transistor 12. The source electrode S10 is connected to the low potential input terminal 2b. The tenth MOS transistor 20 operates complementarily to the second MOS transistor 12. That is, when the tenth MOS transistor 20 is turned on, the second MOS transistor 12 is turned off. When the tenth MOS transistor 20 is turned off, the second MOS transistor 12 is turned on. Thus, when turned on, the tenth MOS transistor 20 outputs the voltage IN− applied to the low potential input terminal 2b. When turned off, the tenth MOS transistor 20 outputs the voltage IN+ applied to the high potential input terminal 2a.

The eleventh MOS transistor 21 is connected between the gate electrode G9 of the ninth MOS transistor 19 and the low potential input terminal 2b by main electrodes. The main electrodes include a drain electrode D11 and a source electrode S11. The drain electrode D11 is connected to the gate electrode G9 of the ninth MOS transistor 19. The source electrode S11 is connected to the low potential input terminal 2b. By being turned on, the eleventh MOS transistor 21 short-circuits between the gate and the source of the ninth MOS transistor 19 to turn off the ninth MOS transistor 19.

The twelfth MOS transistor 22 is connected between the gate electrode G10 of the tenth MOS transistor 20 and the low potential input terminal 2b by main electrodes. The main electrodes include a drain electrode D12 and a source electrode S12. The drain electrode D12 is connected to the gate electrode G10 of the tenth MOS transistor 20. The source electrode S12 is connected to the low potential input terminal 2b. By being turned on, the twelfth MOS transistor 22 short-circuits between the gate and the source of the tenth MOS transistor 20 to turn off the tenth MOS transistor 20.

The thirteenth MOS transistor 23 is connected between the gate electrode Gil of the eleventh MOS transistor 21 and the low potential input terminal 2b by main electrodes. The main electrodes include a drain electrode D13 and a source electrode S13. The drain electrode D13 is connected to the gate electrode G11 of the eleventh MOS transistor 21 through the main electrodes of the fifteenth MOS transistor 25. The source electrode S13 is connected to the low potential input terminal 2b.

The fourteenth MOS transistor 24 is connected between the gate electrode G12 of the twelfth MOS transistor 22 and the low potential input terminal 2b by main electrodes. The main electrodes include a drain electrode D14 and a source electrode S14. The drain electrode D14 is connected to the gate electrode G12 of the twelfth MOS transistor through the main electrodes of the sixteenth MOS transistor 26. The source electrode S14 is connected to the low potential input terminal 2b. The gate electrode G14 of the fourteenth MOS transistor 24 is connected to the gate electrode G13 of the thirteenth MOS transistor 23.

The fifteenth MOS transistor 25 is connected between the gate electrode G11 of the eleventh MOS transistor 21 and the thirteenth MOS transistor 23 by main electrodes. The main electrodes include a drain electrode D15 and a source electrode S15. The drain electrode D15 is connected to the gate electrode G11 of the eleventh MOS transistor 21. The source electrode S15 is connected to the drain electrode D13 of the thirteenth MOS transistor 23.

The sixteenth MOS transistor 26 is connected between the gate electrode G12 of the twelfth MOS transistor 22 and the fourteenth MOS transistor 24 by main electrodes. The main electrodes include a drain electrode D16 and a source electrode S16. The drain electrode D16 is connected to the gate electrode G12 of the twelfth MOS transistor 22. The source electrode 516 is connected to the drain electrode D14 of the fourteenth MOS transistor 24. The gate electrode G16 of the sixteenth MOS transistor 26 is connected to the gate electrode G15 of the fifteenth MOS transistor 25.

The gate electrode G13 of the thirteenth MOS transistor 23 and the gate electrode G14 of the fourteenth MOS transistor 24 connected to each other are connected to the gate electrode G12 of the twelfth MOS transistor 22. The gate electrode G15 of the fifteenth MOS transistor 25 and the gate electrode G16 of the sixteenth MOS transistor 26 connected to each other are connected to the gate electrode G11 of the eleventh MOS transistor 21. The gate electrode G13 and the gate electrode G14 may be connected to the gate electrode G11. In this case, the gate electrode G15 and the gate electrode G16 are connected to the gate electrode G12.

The thirteenth MOS transistor 23 and the fourteenth MOS transistor 24 preferably have an equal transistor size. The thirteenth MOS transistor 23 and the fourteenth MOS transistor 24 constitute a current mirror circuit. A current having the same magnitude as the current flowing in the fourteenth MOS transistor 24 flows in the thirteenth MOS transistor 23.

The fifteenth MOS transistor 25 and the sixteenth MOS transistor 26 preferably have an equal transistor size. The fifteenth MOS transistor 25 and the sixteenth MOS transistor 26 have the same transistor size as the thirteenth MOS transistor 23 and the fourteenth MOS transistor 24. The fifteenth MOS transistor 25 and the sixteenth MOS transistor 26 constitute a current mirror circuit. A current having the same magnitude as the current flowing in the fifteenth MOS transistor 25 flows in the sixteenth MOS transistor 26.

The fifth capacitance element 35 is connected between the signal input terminal 8c and the gate electrode G9 of the ninth MOS transistor 19.

The sixth capacitance element 36 is connected between the signal input terminal 8d and the gate electrode G10 of the tenth MOS transistor 20.

The seventh capacitance element 37 is connected between the signal input terminal 8c and the gate electrode G12 of the twelfth MOS transistor 22.

The eighth capacitance element 38 is connected between the signal input terminal 8d and the gate electrode G11 of the eleventh MOS transistor 21.

The fifth to eighth capacitance elements 35-38 are capacitors similar to the first to fourth capacitance elements 31-34. The DC component of the voltage applied to the fifth to eighth capacitance elements 35-38 is nearly equal to the difference between the voltage IN− applied to the low potential input terminal 2b and the L level voltage of the signal φ3, φ4. The fifth to eighth capacitance elements 35-38 cut the DC component of the signal φ3, φ4 inputted to the signal input terminal 8c, 8d and supply the AC component to the ninth MOS transistor 19 or the like. Thus, the fifth to eighth capacitance elements 35-38 have a capacitance value depending on the breakdown voltage more than or equal to the voltage IN− and the frequency of the input signal supplied to the level shift circuit 1.

The voltage of the DC component applied across the fifth to eighth capacitance elements 35-38 is the difference between the voltage IN− and the L level voltage of the signal φ3, φ4. Thus, when the signal φ3, φ4 reaches L level, the gate-source voltage of the ninth to twelfth MOS transistors 19-22 becomes nearly 0 V. Accordingly, the ninth to twelfth MOS transistors 19-22 are turned off. When the signal φ3, φ4 reaches H level, the gate-source voltage applied to the ninth to twelfth MOS transistors 19-22 is the voltage difference between the voltage IN− and the voltage amplitude of the signal φ3, φ4. Accordingly, the ninth to twelfth MOS transistors 19-22 are turned on.

The circuit portion including the ninth to twelfth MOS transistors 19-22 is a bistable multivibrator. When the signal φ3 reaches H level, the ninth MOS transistor 19 and the twelfth MOS transistor 22 are turned on nearly simultaneously. By turn-on of the twelfth MOS transistor 22, the tenth MOS transistor 20 is turned off. Subsequently, when the signal φ4 (complementary input signal) reaches H level, the tenth MOS transistor 20 and the eleventh MOS transistor 21 are turned on. By turn-on of the eleventh MOS transistor 21, the ninth MOS transistor 19 is turned off.

Thus, the ninth MOS transistor 19 and the tenth MOS transistor 20 are alternately turned on/off in accordance with the signal φ3, φ4. When the signal φ3 is H level, the ninth MOS transistor 19 is turned on. Thus, the voltage IN− is outputted to the output terminal 4a (out-of-phase output with respect to the signal φ3). On the other hand, the signal φ4 operates complementarily to the signal φ3. Thus, when the signal φ4 is L level, the ninth MOS transistor 19 is on. Accordingly, the voltage IN− is outputted to the output terminal 4a (in-phase output with respect to the signal φ4). Likewise, when the signal φ4 is H level (the signal φ3 is L level), the ninth MOS transistor 19 is off. Thus, the voltage IN+ is outputted to the output terminal 4a. That is, H level and L level of the signal φ3, φ4 are level-shifted to the output of the voltage IN− and the voltage IN+.

The thirteenth to sixteenth MOS transistors 23-26 constitute a current mirror circuit. The thirteenth to sixteenth MOS transistors 23-26 operate as an active load for the differential input of the signal φ3, φ4 through the seventh capacitance element 37 and the eighth capacitance element. The thirteenth to sixteenth MOS transistors 23-26 prevent the eleventh MOS transistor 21 and the twelfth MOS transistor 22 from failing to be turned off when the decrease of the voltage applied to the low potential input terminal 2b results in the increase of the voltage applied between the gate and the source of the eleventh MOS transistor 21 and the twelfth MOS transistor 22. Specifically, the thirteenth to sixteenth MOS transistors 23-26 detect the decrease of the voltage applied to the low potential input terminal 2b. Then, the thirteenth to sixteenth MOS transistors 23-26 charge the eighth capacitance element 38 and the seventh capacitance element 37 with charge corresponding to the decreased amount of the voltage applied to the low potential input terminal 2b. The thirteenth to sixteenth MOS transistors 23-26 detect that the gate-source voltage of the eleventh MOS transistor 21 and the twelfth MOS transistor 22 has reached an appropriate value. Then, the thirteenth to sixteenth MOS transistors 23-26 stop charging the eighth capacitance element 38 and the seventh capacitance element 37.

In the case where the voltage applied between the high potential input terminal 2a and the low potential input terminal 2b is a high voltage exceeding 5 V, the DMOS (double-diffused MOSFET) structure is used for the first MOS transistor 11, the second MOS transistor 12, the ninth MOS transistor 19, and the tenth MOS transistor 20. Use of the DMOS structure can increase the breakdown voltage of the drain-source voltage.

The detailed operation of the level shift circuit 1 of this embodiment is now described.

Figure 3:
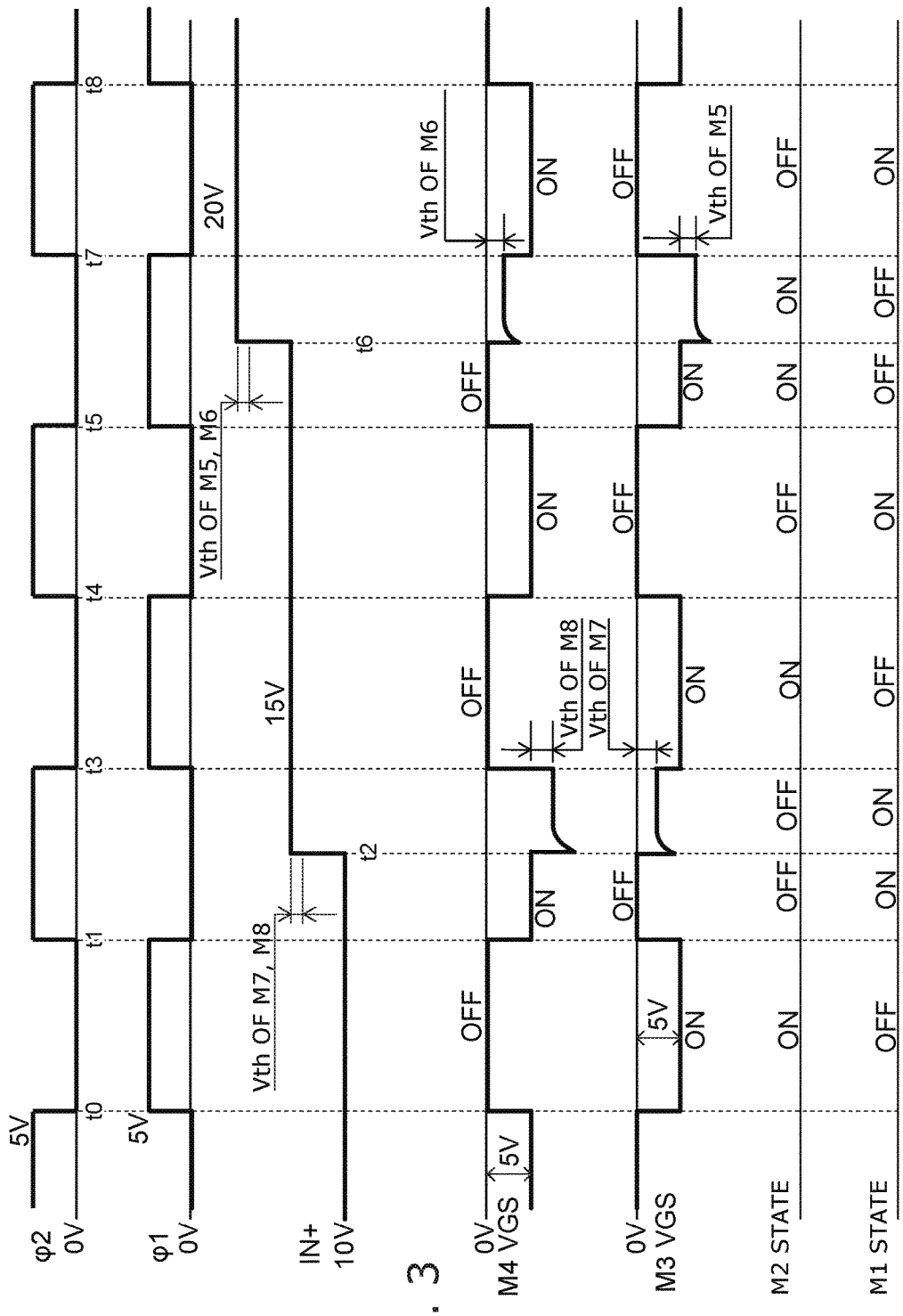
FIG. 3 is a timing chart describing an example of operation for the level shift circuit according to the first embodiment.
Figure 4:
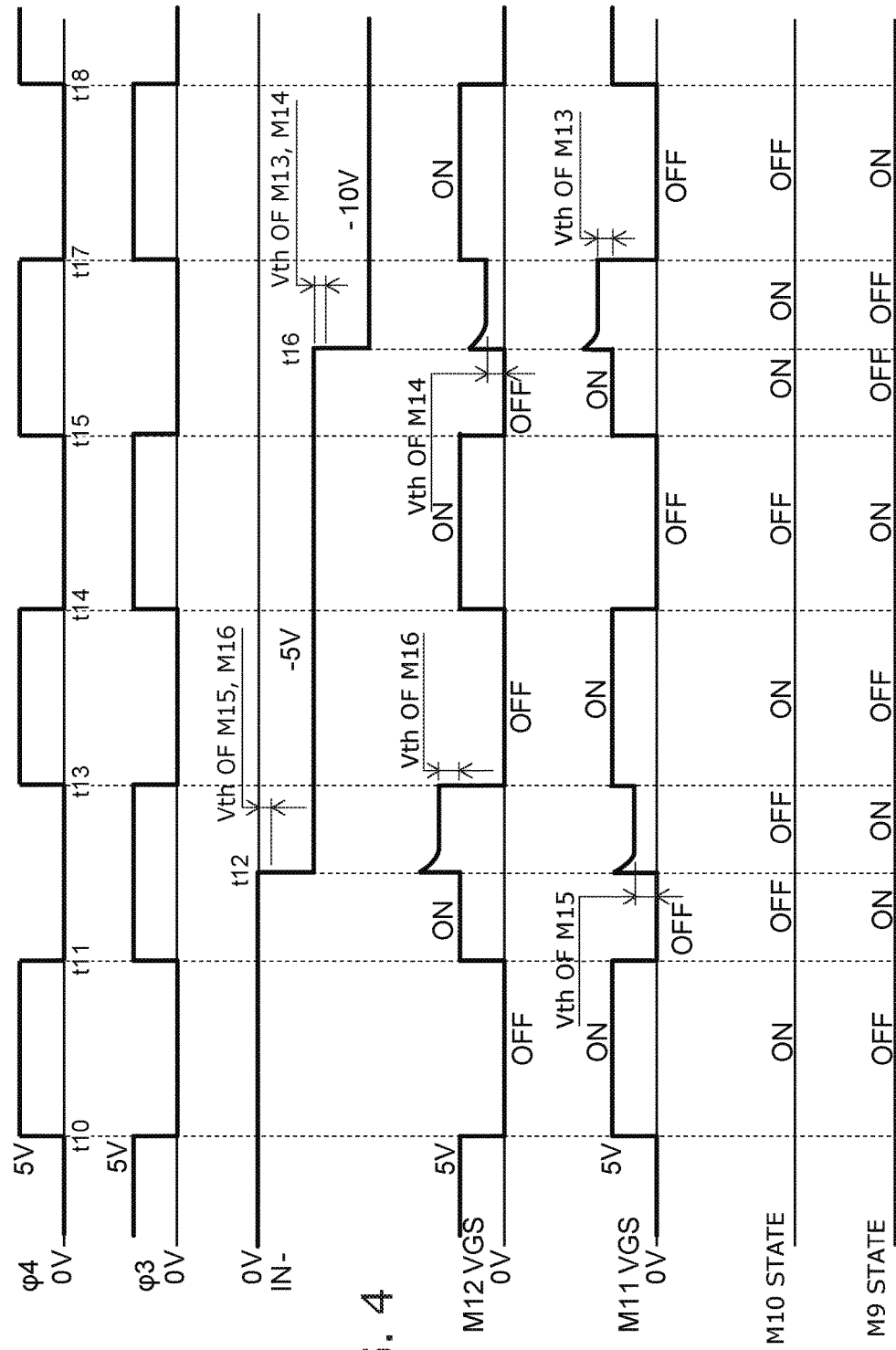
FIG. 4 is a timing chart describing an example of operation for the level shift circuit according to the first embodiment.

FIGS. 3 and 4 are timing charts showing an operation example of the level shift circuit 1 of this embodiment.

In the portion of the level shift circuit 1 composed of the p-channel MOS transistors, when the potential of the high potential input terminal 2a is increased, the charging path to the third capacitance element 33 and the fourth capacitance element 34 is formed from the fifth to eighth MOS transistors 15-18 constituting an active load. When the potential of the high potential input terminal 2a is decreased, the voltage below the threshold does not continue to be applied between the gate and the source of the third MOS transistor 13 and the fourth MOS transistor 14. This enables normal operation irrespective of the operation of the fifth to eighth MOS transistors 15-18.

On the other hand, in the portion of the level shift circuit composed of the n-channel MOS transistors, when the potential of the low potential input terminal 2b is decreased, the charging path to the seventh capacitance element 37 and the eighth capacitance element 38 is formed from the thirteenth to sixteenth MOS transistors 23-26 constituting an active load. When the voltage of the low potential input terminal 2b is increased, the voltage above the threshold does not continue to be applied between the gate and the source of the eleventh MOS transistor 21 and the twelfth MOS transistor 22. This enables normal operation irrespective of the operation of the thirteenth to sixteenth MOS transistors 23-26.

Thus, the following description is divided into the portion of the level shift circuit composed of the p-channel MOS transistors and the portion of the level shift circuit composed of the n-channel MOS transistors. First, the operation of the portion of the level shift circuit composed of the p-channel MOS transistors is described.

The waveforms shown on the top row and the second row of FIG. 3 represent the signals φ2, φ1 inputted to the signal input terminals 8b, 8a, respectively. The signals φ1, φ2 have complementary waveforms. That is, when the signal φ1 is H level, the signal φ2 is L level. When the signal φ1 is L level, the signal φ2 is H level. The duty cycle of the L level and the H level of the signal φ1 can be set arbitrarily. The duty cycle may or may not be 50%. Although not shown herein, the signals φ1, φ2 are provided with a dead time for preventing simultaneous turn-on due to the switching time of the MOS transistors driven by the signals φ1, φ2. In the dead time, the signals φ1, φ2 are both H level. In this example, the H level of the signals φ1, φ2 is 5 V, and the L level is 0 V.

The waveform shown on the third row of FIG. 3 represents the voltage IN+ applied to the high potential input terminal 2a. The voltage IN+ is represented by the potential from the ground terminal 7 of the signal generator 44 and the buffer circuit 42. In this example, the voltage IN+ is 10 V at time t0-t2, 15 V at time t2-t6, and 20 V at time t6-t8. The voltage IN− applied to the low potential input terminal 2b is lower than the voltage IN+.

The waveforms shown on the fourth row and the fifth row of FIG. 3 represent the gate-source voltage of the fourth MOS transistor 14 and the gate-source voltage of the third MOS transistor 13, respectively. The first to eighth MOS transistors 11-18 are p-channel MOS transistors. Thus, the first to eighth MOS transistors 11-18 are turned on when the voltage applied to the gate electrode is lower than the voltage applied to the source electrode. When the potential of the gate electrode is equal (H level) to the potential of the source electrode, the MOS transistor is turned off. When the potential of the gate electrode is lower by the threshold voltage than the potential of the source electrode, the MOS transistor is turned on.

The sixth row and the bottom row of FIG. 3 represent which of the on-state and the off-state is assumed by the second MOS transistor 12 and the first MOS transistor 11.

At time t0-t1, the signal φ2 is L level, The third MOS transistor (M3) 13 is applied 5 V between the gate and the source. Thus, the third MOS transistor (M3) 13 is on. The second MOS transistor (M2) 12 is also applied 5 V between the gate and the source. Thus, the second MOS transistor (M2) 12 is on. By turn-on of the third MOS transistor 13, the first MOS transistor (M1) 11 is nearly short-circuited between the gate and the source. Thus, the first MOS transistor (M1) 11 is off.

The gate electrodes G5, G6 of the fifth MOS transistor (M5) 15 and the sixth MOS transistor (M6) 16 are connected to the gate electrode G4 of the fourth MOS transistor (M4). Thus, the potential of the gate electrodes G5, G6 is equal to the potential of the voltage IN+ by the H level of the signal φ1. Accordingly, the fifth MOS transistor (M5) 15 and the sixth MOS transistor (M6) 16 are off.

The gate electrodes G7, G8 of the seventh MOS transistor (M7) 17 and the eighth MOS transistor (M8) 18 are connected to the gate electrode G3 of the third MOS transistor (M3). Thus, the potential of the gate electrodes G7, G8 is equal to the potential being 5 V lower than the voltage IN+ by the L level of the signal φ2. Accordingly, the seventh MOS transistor (M7) 17 and the eighth MOS transistor (M8) 18 are on.

At time t1-t2, the signal φ2 is H level, and the signal φ1 is L level. Thus, the fourth MOS transistor (M4) is applied 5 V between the gate and the source. Accordingly, the fourth MOS transistor (M4) is turned on. The first MOS transistor (M1) is also turned on by the signal φ1. By turn-on of the fourth MOS transistor (M4) 14, the second MOS transistor (M2) 12 is short-circuited between the gate and the source. Thus, the second MOS transistor (M2) is turned off.

The gate electrodes G5, G6 of the fifth MOS transistor (M5) 15 and the sixth MOS transistor (M6) 16 are connected to the gate electrode G4 of the fourth MOS transistor (M4) 14. Thus, the gate electrodes G5, G6 are applied a voltage being 5 V lower than the voltage IN+. Accordingly, during time t1-t2, the fifth MOS transistor (M5) 15 and the sixth MOS transistor (M6) 16 are on.

The gate electrodes G7, G8 of the seventh MOS transistor (M7) 17 and the eighth MOS transistor (M8) 18 are connected to the gate electrode G3 of the third MOS transistor (M3) 13. Thus, the gate electrodes G7, G8 are placed at the potential of the voltage IN+. Accordingly, during time t1-t2, the seventh MOS transistor (M7) 17 and the eighth MOS transistor (M8) are off.

At time t2, the voltage IN+ increases to 15 V. The potential of the gate electrodes G7, G8 of the seventh MOS transistor (M7) 17 and the eighth MOS transistor (M8) 18 are the potential of the voltage IN+ before the increase by the H level of the signal φ2. Thus, the potential of the gate electrodes G7, G8 has a voltage value of 10 V.

At this time, the sixth MOS transistor (M6) 16 is on. Thus, the potential of the source electrode S8 of the eighth MOS transistor (M8) 18 increases with the voltage IN+. When the gate-source voltage of the eighth MOS transistor (M8) 18 exceeds the threshold voltage of the eighth MOS transistor (M8), the eighth MOS transistor (M8) 18 is turned on and passes a current. By turn-on of the eighth MOS transistor (M8), the third capacitance element (C3) 33 is charged.

Simultaneously, the fifth MOS transistor (M5) 15 is on. Thus, the potential of the source electrode S7 of the seventh MOS transistor (M7) 17 increases with the voltage IN+. When the gate-source voltage of the seventh MOS transistor (M7) 17 exceeds the threshold voltage of the seventh MOS transistor (M7) 17, the seventh MOS transistor (M7) 17 is turned on. By turn-on of the seventh MOS transistor (M7), the fourth capacitance element (C4) 34 is charged.

The fourth capacitance element (C4) 34 is charged by the charging path including the fifth MOS transistor (M5) 15 and the seventh MOS transistor (M7) 17. The potential of the drain electrode D7 of the seventh MOS transistor (M7) 17 increases in accordance with the accumulated amount of charge. When the potential difference between the increased potential of the drain electrode D7 and the voltage IN+ becomes less than or equal to the threshold voltage of the seventh MOS transistor (M7) 17, the seventh MOS transistor (M7) 17 is turned off.

The third capacitance element (C3) 33 is charged by the charging path including the sixth MOS transistor (M6) 16 and the eighth MOS transistor (M8) 18, The potential of the drain electrode D8 of the eighth MOS transistor (M8) 18 increases in accordance with the accumulated amount of charge. The eighth MOS transistor (M8) and the seventh MOS transistor (M7) 17 constitute a current mirror circuit, and have an equal transistor size. Thus, the value of the current charging the fourth capacitance element (C4) 34 is equal to the value of the current charging the third capacitance element (C3) 33. The third capacitance element (C3) 33 and the fourth capacitance element (C4) 34 are set to an equal capacitance. Thus, the third capacitance element (C3) 33 and the fourth capacitance element (C4) 34 have an equal voltage increase value.

By turn-off of the seventh MOS transistor (M7), the eighth MOS transistor (M8) 18 constituting a current mirror circuit with the seventh MOS transistor (M7) 17 is turned off. That is, the seventh MOS transistor (M7) 17 and the eighth MOS transistor (M8) 18 are turned off nearly simultaneously and terminate the charging operation on the third capacitance element (C3) 33 and the fourth capacitance element (C4) 34.

That is, when the potential of the drain electrode D7 of the seventh MOS transistor (M7) 17 increases to 15 V, the seventh MOS transistor (M7) 17 is turned off. The charging current of the third capacitance element (C3) 33 and the fourth capacitance element (C4) 34 is equal. Thus, when the potential of the drain electrode D8 of the eighth MOS transistor (M8) 18 reaches 10 V being 5 V lower than the potential of the drain electrode D7, the eighth MOS transistor (M8) 18 is turned off. Accordingly, a nearly equal amount of charge is accumulated in the third capacitance element 33 and the fourth capacitance element 34. The value of the voltage across each capacitance element becomes nearly equal to the difference between the potential of the voltage IN+ and the potential of the H level of the signal φ1, φ2.

The operation at time t2-t3 is kept in the same state as the operation at time t1-t2.

At time t3-t4, φ2 is L level. Thus, as in the case of time t0-t1, the second MOS transistor (M2) 12 is turned on. Because the third MOS transistor (M3) 13 is turned on, the first MOS transistor (M1) 11 is turned off. At this time, the gate electrodes G5, G6 of the fifth MOS transistor (M5) 15 and the sixth MOS transistor (M6) 16 are H level. Thus, the fifth MOS transistor (M5) 15 and the sixth MOS transistor (M6) 16 are in the off-state. On the other hand, the gate electrodes G7, G8 of the seventh MOS transistor (M7) 17 and the eighth MOS transistor (M8) 18 are L level. Thus, the seventh MOS transistor (M7) 17 and the eighth MOS transistor (M8) 18 are in the on-state.

At time t4-t5, φ1 is L level. Thus, as in the case of time t1-t2, the first MOS transistor (M1) 11 is turned on. Because the fourth MOS transistor (M4) 14 is turned on, the second MOS transistor (M2) 12 is turned off. At this time, the gate electrodes G7, G8 of the seventh MOS transistor (M7) 17 and the eighth MOS transistor (M8) 18 are H level. Thus, the seventh MOS transistor (M7) 17 and the eighth MOS transistor (M8) 18 are in the off-state. The gate electrodes G5, G6 of the fifth MOS transistor (M5) 15 and the sixth MOS transistor (M6) 16 are L level. Thus, the fifth MOS transistor (M5) 15 and the sixth MOS transistor (M6) 16 are in the on-state.

At time t5-t6, the signal φ2 is L level. Thus, the second MOS transistor (M2) 12 is turned on, and the third MOS transistor (M3) 13 is turned on. By turn-on of the third MOS transistor (M3) 13, the first MOS transistor (M1) is turned off. At this time, the gate electrodes G7, G8 of the seventh MOS transistor (M7) 17 and the eighth MOS transistor (M8) 18 are L level. Thus, the seventh MOS transistor (M7) 17 and the eighth MOS transistor (M8) 18 are on. The gate electrodes G5, G6 of the fifth MOS transistor (M5) 15 and the sixth MOS transistor (M6) 16 are H level. Thus, the fifth MOS transistor (M5) 15 and the sixth MOS transistor (M6) 16 are off.

At time t6, the voltage IN+ further increases by 5 V to 20 V. The potential of the gate electrodes G5, G6 of the fifth MOS transistor (M5) and the sixth MOS transistor (M6) 16 is equal to the potential of the voltage IN+ by the H level of the signal φ1, and fixed to 15 V, which is the value immediately before time t6.

The potential of the source electrode S5 of the fifth MOS transistor (M5) 15 increases with the voltage IN+. When the gate-source voltage of the fifth MOS transistor (M5) 15 becomes less than or equal to the threshold voltage of the fifth MOS transistor (M5) 15, the fifth MOS transistor (M5) 15 is turned on.

Simultaneously, the sixth MOS transistor (M6) 16 constituting a current mirror circuit with the fifth MOS transistor (M5) 15 is turned on.

A charging path including the fifth MOS transistor (M5) 15 and the seventh MOS transistor (M7) 17 is formed, and the fourth capacitance element (C4) 34 is charged.

A charging path including the sixth MOS transistor (M6) 16 and the eighth MOS transistor (M8) 18 is formed, and the third capacitance element (C3) 33 is charged.

The fifth MOS transistor (M5) 15 and the sixth MOS transistor (M6) 16 have an equal transistor size and constitute a current mirror circuit. Thus, the fifth MOS transistor (M5) 15 and the sixth MOS transistor (M6) 16 charge the fourth capacitance element (C4) 34 and the third capacitance element (C3) 33 with an equal current value.

The potential of the drain electrode D8 of the eighth MOS transistor (M8) 18 increases with the increase of the potential of the third capacitance element (C3) 33. The potential of the gate electrode G6 of the sixth MOS transistor (M6) connected to the drain electrode D8 also increases. When the gate-source voltage of the sixth MOS transistor (M6) 16 becomes higher than the threshold voltage of the sixth MOS transistor (M6) 16, the sixth MOS transistor (M6) 16 is turned off.

Because the sixth MOS transistor (M6) 16 is turned off, the fifth MOS transistor (M5) 15 constituting a current mirror circuit with the sixth MOS transistor (M6) 16 is turned off.

The third capacitance element (C3) 33 and the fourth capacitance element (C4) 34 are set to an equal capacitance. Thus, the amount of voltage increase is equal in the third capacitance element (C3) 33 and the fourth capacitance element (C4) 34. Thus, a nearly equal amount of charge is accumulated in the third capacitance element 33 and the fourth capacitance element 34. The value of the voltage across each capacitance element becomes nearly equal to the difference between the potential of the voltage IN+ and the potential of the H level of the signal φ1, φ2.

The operation of the MOS transistor (M1) 11 and the MOS transistor (M2) 12 at time t6-t7 is continued in the same state as the operation at time t5-t6.

At time t7-t8, as in the case of time t1-t2 and time t4-t5, by the signal φ1, the first MOS transistor (M1) 11 is turned on, and the fourth MOS transistor (M4) 14 is turned on. By turn-on of the fourth MOS transistor (M4) 14, the second MOS transistor (M2) 12 is turned off.

Thus, by detecting the increase of the voltage IN+, the current mirror circuit composed of the seventh MOS transistor (M7) 17 and the eighth MOS transistor (M8) 18 or the current mirror circuit composed of the fifth MOS transistor (M5) 15 and the sixth MOS transistor (M6) 16, which has been off, is turned on. By turn-on of the current mirror circuit, the third capacitance element (C3) 33 and the fourth capacitance element (C4) 34 are charged with an equal current value. The third capacitance element (C3) and the fourth capacitance element (C4) 34 have an equal capacitance. Thus, the flow of an equal charging current results in an equal increase of voltage. By detecting becoming nearly equal to the increased voltage IN+, the seventh MOS transistor (M7) 17 and the eighth MOS transistor (M8) 18, or the fifth MOS transistor (M5) 15 and the sixth MOS transistor (M6) 16, are turned off again. Thus, the voltage across the third capacitance element (C3) 33 and the fourth capacitance element (C4) 34 becomes nearly equal by the addition of the increased amount of the voltage IN+.

Next, the operation of the portion of the level shift circuit composed of the n-channel MOS transistors is described.

The waveforms shown on the top row and the second row of FIG. 4 represent the signals $\phi 4$, $\phi 3$ inputted to the signal input terminals 8d, 8c, respectively. The signals $\phi 3$, $\phi 4$ have complementary waveforms. That is, when the signal $\phi 3$ is H level, the signal $\phi 4$ is L level. When the signal $\phi 3$ is L level, the signal $\phi 4$ is H level. The signals $\phi 3$, $\phi 4$ are in the same logical relation to the signals $\phi 1$, $\phi 2$ for the portion of the level shift circuit composed of the p-channel MOS transistors, respectively. That is, when the signal $\phi 3$ is L level, the signal $\phi 1$ is L level. When the signal $\phi 3$ is H level, the signal $\phi 1$ is H level. When the signal $\phi 4$ is L level, the signal $\phi 2$ is L level. When the signal $\phi 4$ is H level, the signal $\phi 2$ is H level. The duty cycle of the H level and the L level of the signal $\phi 3$, $\phi 4$ can be set arbitrarily. The duty cycle may or may not be 50%. Although not shown herein, the signals $\phi 3$, $\phi 4$ are provided with a dead time for preventing simultaneous turn-on due to the switching time of the MOS transistors. In the dead time, the signals $\phi 3$, $\phi 4$ are both L level. The H level of the signals $\phi 3$, $\phi 4$ is 5 V, and the L level is 0 V.

The waveform shown on the third row of FIG. 4 represents the voltage IN− applied to the low potential input terminal 2b. The voltage IN− is represented by the potential from the ground terminal 7 of the signal generator 44 and the buffer circuit 42. In this example, the voltage IN− is 0 V at time t10-t12, −5 V at time t12-t16, and −10 V at time t16-t18. The voltage IN+ applied to the high potential input terminal 2a is higher than the voltage IN−.

The waveforms shown on the fourth row and the fifth row of FIG. 4 represent the gate-source voltage of the twelfth MOS transistor 22 and the gate-source voltage of the eleventh MOS transistor 21, respectively. The ninth to sixteenth MOS transistors 19-26 are n-channel MOS transistors. Thus, the ninth to sixteenth MOS transistors 19-26 are turned on when the voltage applied to the gate electrode is higher than the voltage applied to the source electrode. In the case where the amplitude of the signal $\phi 3$, $\phi 4$ is 5 V, when the potential of the gate electrode is higher (H level) to the potential of the source electrode, the MOS transistor is turned on. When the potential of the gate electrode is nearly equal (L level) to the potential of the source electrode, the MOS transistor is turned off.

The sixth row and the seventh row of FIG. 4 represent which of the on-state and the off-state is assumed by the tenth MOS transistor 20 and the ninth MOS transistor 19.

At time t10-t11, the signal $\phi 4$ is H level. The tenth MOS transistor (M10) 20 is applied 5 V between the gate and the source. Thus, the tenth MOS transistor (M10) 20 is on. The eleventh MOS transistor (M11) 21 is also applied 5 V between the gate and the source. Thus, the eleventh MOS transistor (M11) 21 is on. By turn-on of the eleventh MOS transistor 21, the ninth MOS transistor (M9) 19 is short-circuited between the gate and the source. Thus, the ninth MOS transistor (M9) 19 is off.

The gate electrodes G13, G14 of the thirteenth MOS transistor (M13) 23 and the fourteenth MOS transistor (M14) 24 are connected to the gate electrode G12 of the twelfth MOS transistor (M12). Thus, the potential of the gate electrodes G13, G14 is equal to the potential of the voltage IN− by the L level of the signal $\phi 3$. Accordingly, the thirteenth MOS transistor (M13) 23 and the fourteenth MOS transistor (M14) 24 are off. The gate electrodes G15, G16 of the fifteenth MOS transistor (M15) 25 and the sixteenth MOS transistor (M16) 26 are connected to the gate electrode G11 of the eleventh MOS transistor (M11). Thus, the potential of the gate electrodes G15, G16 is equal to the potential being 5 V higher than the voltage IN− by the H level of the signal $\phi 4$. Accordingly, the fifteenth MOS transistor (M15) 25 and the sixteenth MOS transistor (M16) 26 are on.

At time t11-t12, the signal $\phi 4$ is L level, and the signal $\phi 3$ is H level. Thus, the ninth MOS transistor (M9) 19 is turned on, and the twelfth MOS transistor (M12) 22 is turned on. By turn-on of the twelfth MOS transistor (M12), the tenth MOS transistor (M10) 20 is turned off.

The gate electrodes G13, G14 of the thirteenth MOS transistor (M13) 23 and the fourteenth MOS transistor (M14) 24 are connected to the gate electrode G12 of the twelfth MOS transistor (M12) 22. Thus, the potential of the gate electrodes G13, G14 is equal to the potential being 5 V higher than the voltage IN− by the H level of the signal $\phi 3$. Accordingly, the thirteenth MOS transistor (M13) 23 and the fourteenth MOS transistor (M14) 24 are on. The gate electrodes G15, G16 of the fifteenth MOS transistor (M15) 25 and the sixteenth MOS transistor (M16) 26 are connected to the gate electrode G11 of the eleventh MOS transistor (M11) 21. Thus, the potential of the gate electrodes G15, G16 is equal to the potential of the voltage IN− by the L level of the signal $\phi 4$. Accordingly, the fifteenth MOS transistor (M15) 25 and the sixteenth MOS transistor (M16) 26 are off.

At time t12, the voltage IN− decreases from 0 V to −5 V. The potential of the gate electrodes G15, G16 of the fifteenth MOS transistor (M15) 25 and the sixteenth MOS transistor (M16) 26 are the potential of the voltage IN− before the decrease by the L level of the signal $\phi 4$. Thus, the potential of the gate electrodes G15, G16 has a voltage value of 0 V.

At this time, the fourteenth MOS transistor (M14) 24 is on. Thus, the potential of the source electrode S16 of the sixteenth MOS transistor (M16) 26 decreases with the voltage IN−. When the gate-source voltage of the sixteenth MOS transistor (M16) 26 exceeds the threshold voltage of the sixteenth MOS transistor (M16) 26, the sixteenth MOS transistor (M16) 26 is turned on and passes a current. By turn-on of the sixteenth MOS transistor (M16) 26, the seventh capacitance element (C7) 37 is charged.

Simultaneously, the thirteenth MOS transistor (M13) 23 is on. Thus, the potential of the source electrode S15 of the fifteenth MOS transistor (M15) 25 decreases with the voltage IN−. When the gate-source voltage of the fifteenth MOS transistor (M15) 25 exceeds the threshold voltage of the fifteenth MOS transistor (M15) 25, the fifteenth MOS transistor (M15) 25 is turned on. By turn-on of the fifteenth MOS transistor (M15) 25, the eighth capacitance element (C8) 38 is charged.

The eighth capacitance element (C8) 38 is charged by the charging path including the thirteenth MOS transistor (M13) 23 and the fifteenth MOS transistor (M15) 25. The potential of the drain electrode D15 of the fifteenth MOS transistor (M15) 25 decreases in accordance with the accumulated amount of charge. The potential of the gate electrode G15 connected to the drain electrode D15 decreases. When the potential difference between the decreased potential of the gate electrode G15 and the voltage IN− becomes less than or equal to the threshold voltage of the fifteenth MOS transistor (M15) 25, the fifteenth MOS transistor (M15) 25 is turned off.

The seventh capacitance element (C7) 37 is charged by the charging path including the fourteenth MOS transistor (M14) 24 and the sixteenth MOS transistor (M16) 26. The potential of the drain electrode D16 of the sixteenth MOS transistor (M16) 26 decreases in accordance with the accumulated amount of charge. The sixteenth MOS transistor (M16) and the fifteenth MOS transistor (M15) 25 constitute a current mirror circuit, and have an equal transistor size. Thus, the value of the current charging the eighth capacitance element (C8) 38 is equal to the value of the current charging the seventh capacitance element (C7) 37. The seventh capacitance element (C7) 37 and the eighth capacitance element (C8) 38 are set to an equal capacitance. Thus, the seventh capacitance element (C7) 37 and the eighth capacitance element (C8) 38 have an equal voltage increase value.

By turn-off of the fifteenth MOS transistor (M15), the sixteenth MOS transistor (M16) 26 constituting a current mirror circuit with the fifteenth MOS transistor (M15) 25 is turned off. That is, the fifteenth MOS transistor (M15) 25 and the sixteenth MOS transistor (M16) 26 are turned off nearly simultaneously and terminate the charging operation on the seventh capacitance element (C7) 37 and the eighth capacitance element (C8) 38.

That is, when the potential of the drain electrode D15 of the fifteenth MOS transistor (M15) 25 decreases to −5 V, the fifteenth MOS transistor (M15) 25 is turned off. The charging current of the seventh capacitance element (C7) 37 and the eighth capacitance element (C8) 38 is equal. Thus, when the potential of the drain electrode D16 of the sixteenth MOS transistor (M16) 26 reaches 0 V being 5 V higher than the potential of the drain electrode D15, the twelfth MOS transistor (M12) 22 is turned on, and the tenth MOS transistor (M10) 20 is turned off. Accordingly, a nearly equal amount of charge is accumulated in the seventh capacitance element 37 and the eighth capacitance element 38. The value of the voltage across each capacitance element becomes nearly equal to the difference between the potential of the voltage IN− and the potential of the L level of the signal φ3, φ4.

The operation of the MOS transistor (M9) 19 and the MOS transistor (M10) 20 at time t12-t13 is kept in the same state as the operation at time t11-t12.

At time t13-t14, φ4 is H level. Thus, as in the case of time t10-t11, the tenth MOS transistor (M10) 20 is turned on. Because the eleventh MOS transistor (M11) 21 is turned on, the ninth MOS transistor (M9) 19 is turned off. At this time, the gate electrodes G13, G14 of the thirteenth MOS transistor (M13) 23 and the fourteenth MOS transistor (M14) 24 are L level. Thus, the thirteenth MOS transistor (M13) 23 and the fourteenth MOS transistor (M14) 24 are in the off-state. On the other hand, the gate electrodes G15, G16 of the fifteenth MOS transistor (M15) 25 and the sixteenth MOS transistor (M16) 26 are H level. Thus, the fifteenth MOS transistor (M15) 25 and the sixteenth MOS transistor (M16) 26 are in the on-state.

At time t14-t15, the signal φ3 is H level. Thus, as in the case of time t11-t12, the ninth MOS transistor (M9) 19 is turned on. Because the twelfth MOS transistor (M12) 22 is turned on, the tenth MOS transistor (M10) 20 is turned off. At this time, the gate electrodes G13, G14 of the thirteenth MOS transistor (M13) and the fourteenth MOS transistor (M14) are H level. Thus, the thirteenth MOS transistor (M13) and the fourteenth MOS transistor (M14) are in the on-state. The gate electrodes G15, G16 of the fifteenth MOS transistor (M15) 25 and the sixteenth MOS transistor (M16) 26 are L level, Thus, the fifteenth MOS transistor (M15) 25 and the sixteenth MOS transistor (M16) 26 are in the off-state.

At time t15-t16, the signal φ4 is H level. Thus, the tenth MOS transistor (M10) 20 is turned on, and the eleventh MOS transistor (M11) 21 is turned on. By turn-on of the eleventh MOS transistor (M11) 21, the ninth MOS transistor (M9) is turned off. At this time, the gate electrodes G13, G14 of the thirteenth MOS transistor (M13) 23 and the fourteenth MOS transistor (M14) 24 are L level. Thus, the thirteenth MOS transistor (M13) 23 and the fourteenth MOS transistor (M14) 24 are off. The gate electrodes G15, G16 of the fifteenth MOS transistor (M15) 25 and the sixteenth MOS transistor (M16) 26 are H level. Thus, the fifteenth MOS transistor (M15) 25 and the sixteenth MOS transistor (M16) 26 are on.

At time t16, the voltage IN− further decreases by 5 V to −10 V. The potential of the gate electrodes G13, G14 of the thirteenth MOS transistor (M13) 23 and the fourteenth MOS transistor (M14) 24 is L level by the signal φ3, and fixed to −5 V, which is the value immediately before time t16.

The potential of the source electrode S13 of the thirteenth MOS transistor (M13) 23 decreases with the voltage IN−. When the gate-source voltage of the thirteenth MOS transistor (M13) 23 becomes more than or equal to the threshold voltage of the thirteenth MOS transistor (M13) 23, the thirteenth MOS transistor (M13) 23 is turned on.

Simultaneously, the fourteenth MOS transistor (M14) 24 constituting a current mirror circuit with the thirteenth MOS transistor (M13) 23 is turned on.

A charging path including the thirteenth MOS transistor (M13) 23 and the fifteenth MOS transistor (M15) 25 is formed, and the eighth capacitance element (C8) 38 is charged.

A charging path including the fourteenth MOS transistor (M14) 24 and the sixteenth MOS transistor (M16) 26 is formed, and the seventh capacitance element (C7) 37 is charged.

The thirteenth MOS transistor (M13) 23 and the fourteenth MOS transistor (M14) 24 have an equal transistor size and constitute a current mirror circuit. Thus, the thirteenth MOS transistor (M13) 23 and the fourteenth MOS transistor (M14) 24 charge the eighth capacitance element (C8) 38 and the seventh capacitance element (C7) 37 with an equal current value.

The potential of the drain electrode D16 of the sixteenth MOS transistor (M16) 26 decreases with the potential of the seventh capacitance element (C7) 37. The potential of the gate electrode G14 of the fourteenth MOS transistor (M14) connected to the drain electrode D16 also decreases. When the gate-source voltage of the fourteenth MOS transistor (M14) 24 becomes lower than the threshold voltage of the fourteenth MOS transistor (M14) 24, the fourteenth MOS transistor (M14) 24 is turned off.

Because the fourteenth MOS transistor (M14) 24 is turned off, the thirteenth MOS transistor (M13) 23 constituting a current mirror circuit with the fourteenth MOS transistor (M14) 24 is turned off.

The seventh capacitance element (C7) 37 and the eighth capacitance element (C8) 38 are set to an equal capacitance. Thus, the amount of voltage increase is equal in the seventh capacitance element (C7) 37 and the eighth capacitance element (C8) 38. Thus, a nearly equal amount of charge is accumulated in the seventh capacitance element 37 and the eighth capacitance element 38. The value of the voltage across each capacitance element becomes nearly equal to the difference between the potential of the voltage IN− and the potential of the L level of the signal ϕ3, ϕ4.

The operation of the MOS transistor (M9) 19 and the MOS transistor (M10) 20 at time t16-t17 is continued in the same state as the operation at time t15-t16.

At time t17-t18, as in the case of time t11-t12 and time t14-t15, by the signal ϕ3, the ninth MOS transistor (M9) 19 is turned on, and the twelfth MOS transistor (M12) 22 is turned on. By turn-on of the twelfth MOS transistor (M12) 22, the tenth MOS transistor (M10) 20 is turned off.

The function and effect of the level shift circuit 1 of this embodiment are now described in contrast to a level shift circuit of a comparative example.

Figure 5:
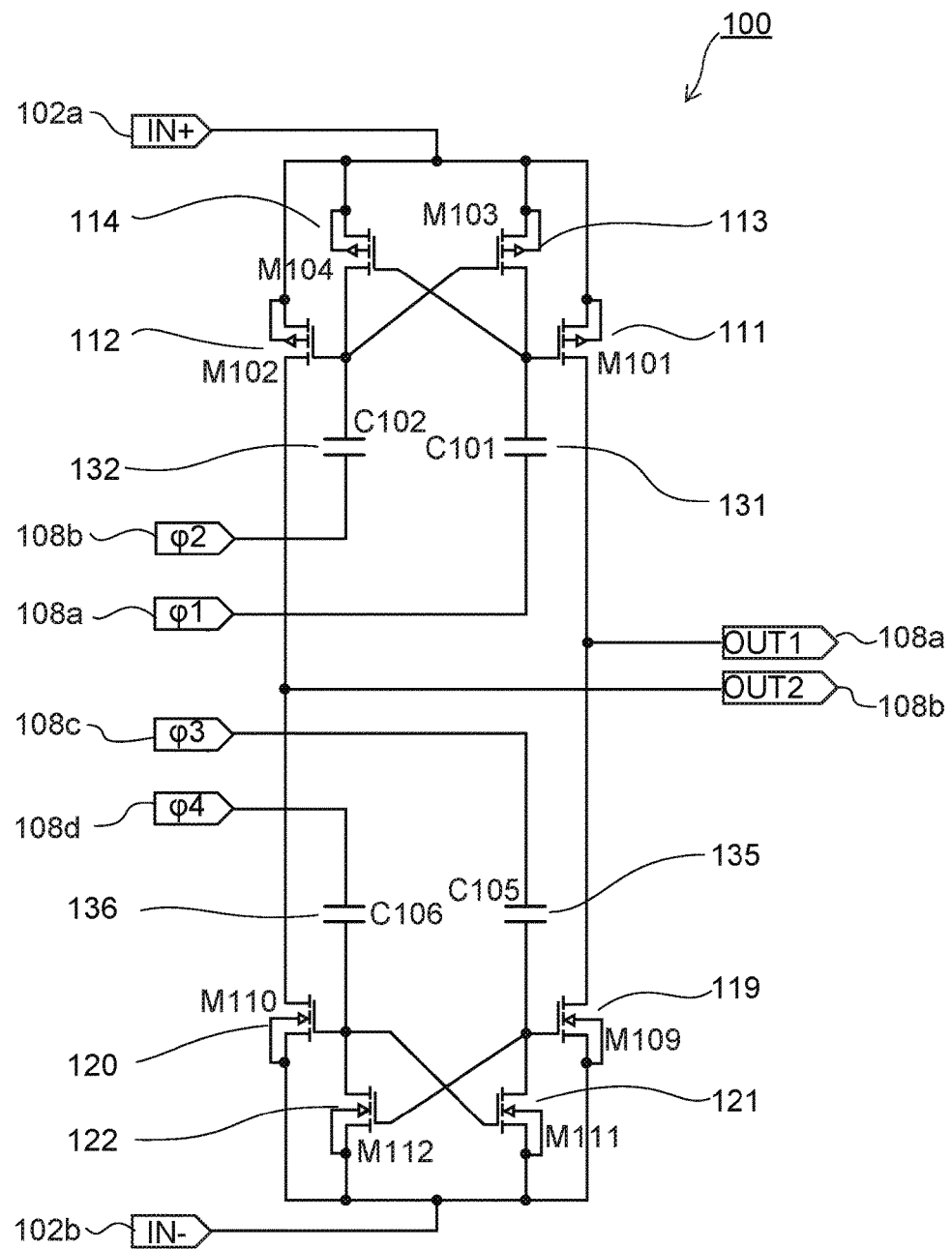
FIG. 5 is a circuit diagram illustrating a level shift circuit of a comparative example.

FIG. 5 is a circuit diagram illustrating a level shift circuit 100 of the comparative example.

Figure 6:
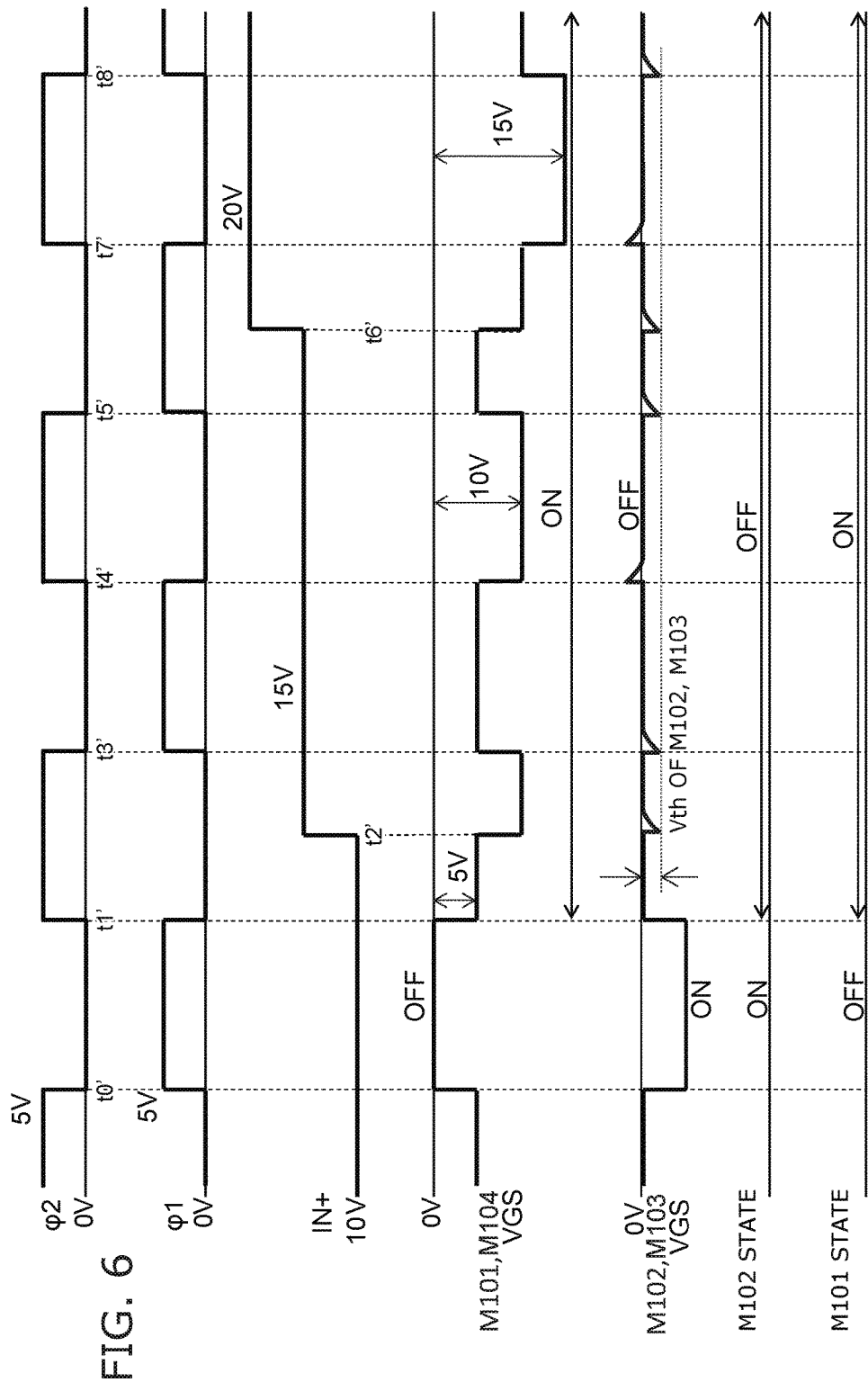
FIG. 6 is a timing chart describing the operation of the level shift circuit of the comparative example.
Figure 7:
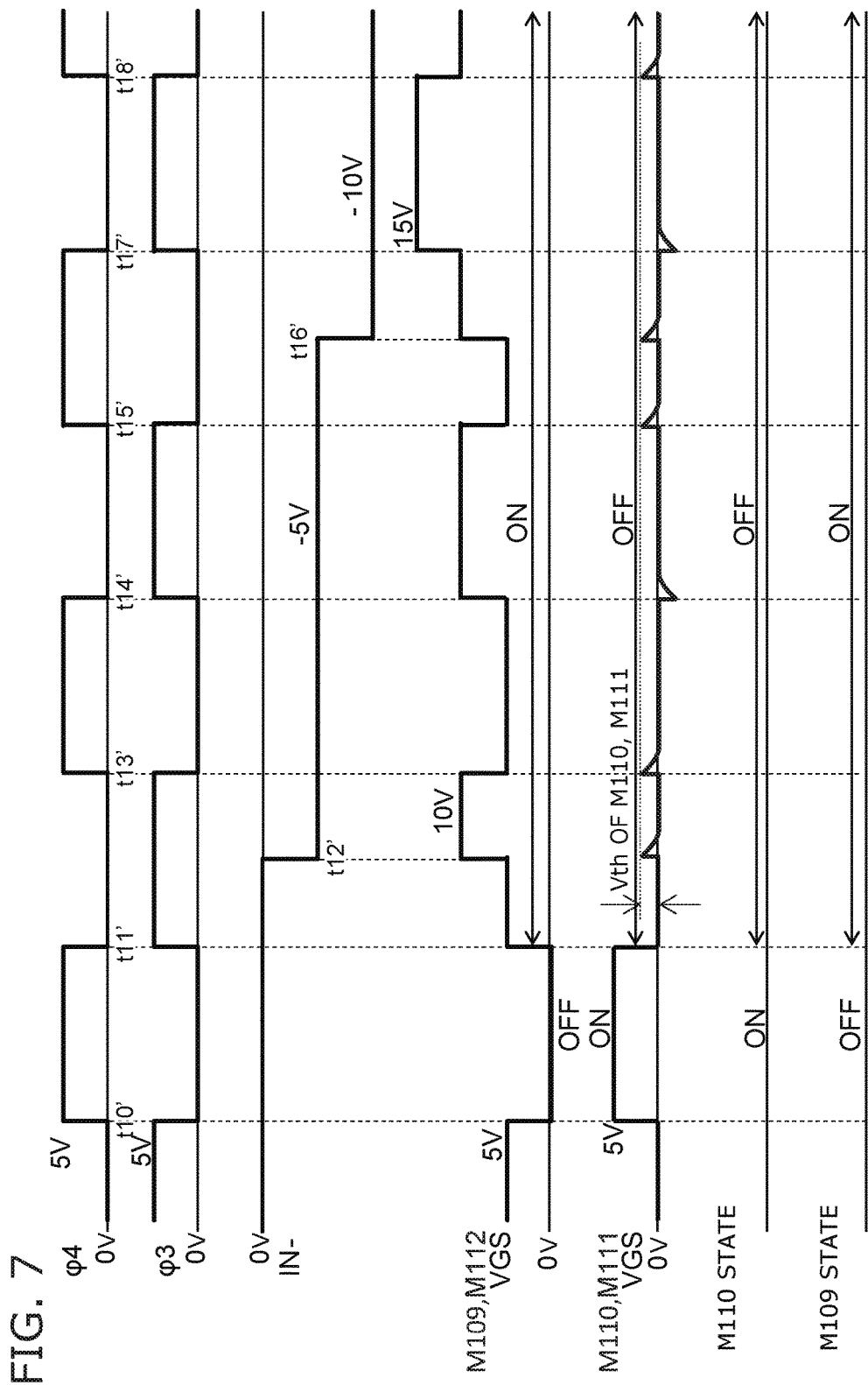
FIG. 7 is a timing chart describing the operation of the level shift circuit 100 of the comparative example.

FIGS. 6 and 7 are timing charts describing the operation of the level shift circuit 100 of the comparative example.

The level shift circuit 100 of the comparative example is different from the level shift circuit 1 of this embodiment in not including the p-channel fifth to eighth MOS transistors 15-18, the third capacitance element 33, and the fourth capacitance element 34. Furthermore, the level shift circuit 100 of the comparative example is different from the level shift circuit 1 of this embodiment also in not including the n-channel thirteenth to sixteenth MOS transistors 23-26, the seventh capacitance element 37, and the eighth capacitance element 38. In the level shift circuit 100 of the comparative example, the gate electrode of the MOS transistor 113 is connected to the gate electrode of the MOS transistor 112. The gate electrode of the MOS transistor 114 is connected to the gate electrode of the MOS transistor 111. In the level shift circuit 100 of the comparative example, the gate electrode of the MOS transistor 121 is connected to the gate electrode of the MOS transistor 120. The gate electrode of the MOS transistor 122 is connected to the gate electrode of the MOS transistor 119.

As in the level shift circuit 1 of this embodiment, the description is divided into the portion of the level shift circuit composed of the p-channel MOS transistors and the portion of the level shift circuit composed of the n-channel MOS transistors. First, the portion of the level shift circuit composed of the p-channel MOS transistors is described.

The waveforms shown from the top row to the bottom row of FIG. 6 are similar to the waveforms in the level shift circuit 1 of this embodiment. That is, the waveforms shown on the top row and the second row of FIG. 6 represent the signals ϕ2, ϕ1 inputted to the signal input terminals 108b, 108a, respectively. The waveform shown on the third row of FIG. 6 represents the voltage IN+ applied to the high potential input terminal 102a. The waveform shown on the fourth row of FIG. 6 represents the gate-source voltage of the MOS transistors 111, 114. The waveform shown on the fifth row represents the gate-source voltage of the MOS transistors 112, 113. The sixth row and the bottom row of FIG. 6 represent which of the on-state and the off-state is assumed by the MOS transistors 112, 111.

At time t2' between time t1' and time t3', the voltage IN+ increases from 10 V to 15 V. At time t1', the signal ϕ1 is L level. Thus, the MOS transistor 111 is on, and the MOS transistor 114 is also on. Because the fourth MOS transistor 114 is on, the MOS transistor 112 is off.

At time t2', the voltage applied to the high potential input terminal 102a (IN+) increases. At this time, the MOS transistor 113 is off. There is no path charging the capacitance element 131 to a voltage matched with the increase of the voltage IN+. Thus, from time t2' on, the 5 V voltage increase of the voltage IN+ is added between the gate and the source of the MOS transistor 114.

At time t3', the signal ϕ1 becomes H level. However, the addition of the 5 V increase of the voltage IN+ is continued. Thus, a total voltage of 10 V is applied between the gate and the source of the MOS transistor 114. The MOS transistor 114 fails to be turned off. Thus, the MOS transistor 113 fails to be turned on even when the signal ϕ2 becomes L level.

Furthermore, at time t6', the voltage IN+ increases to 20 V. Then, as in the foregoing, a voltage of 5 V is further added between the gate and the source of the MOS transistor 114. When the signal ϕ2 becomes L level, a voltage of 15 V is applied between the gate and the source of the MOS transistor 114.

Because the MOS transistor 114 fails to be turned off, the MOS transistor 112 fails to be turned on. Because the MOS transistor 113 fails to be turned off, there is no escape from such a state.

When the voltage IN+ increases at time t2', t6', a current charging the capacitance element 132 flows through the gate-source capacitance of the MOS transistor 113 and the MOS transistor 112. However, the gate-source voltage of the MOS transistor 113 and the MOS transistor 112 cannot exceed the threshold voltage of the MOS transistor 113 and the MOS transistor 112. Thus, the MOS transistor 113 and the MOS transistor 112 fail to be turned on. Also at time t3', t4', t5', t7', t6', in response to the signal ϕ1, ϕ2, a current flows through the gate-source capacitance so that the capacitance element 132 is charged at the rising edge and discharged at the falling edge. However, the gate-source voltage of the MOS transistor 113 and the MOS transistor 112 cannot exceed the threshold voltage. Thus, the MOS transistor 113 and the MOS transistor 112 fail to be turned on.

Thus, the level shift circuit 100 of the comparative example includes no path charging the capacitance element 131, 132 in response to the increase of the voltage applied to the high potential input terminal 102a. Thus, the MOS transistor 113, 114 fails to escape from the on-state or the off-state. This results in stopping the operation of the level shift circuit 100.

This also applies to the portion of the level shift circuit composed of the n-channel MOS transistors. When, the voltage applied to the low potential input terminal 102b decreases, the MOS transistor 121 or the MOS transistor 122 for turning off the MOS transistor 119 or the MOS transistor 120 fails to recover from the on-state. This results in stopping the operation of the level shift circuit.

The waveforms shown on the top row and the second row of FIG. 7 represent the signals ϕ4, ϕ3 inputted to the signal input terminals 108d, 108c, respectively. The waveform shown on the third row of FIG. 7 represents the voltage IN− applied to the low potential input terminal 102b. The waveforms shown on the fourth row and the fifth row of FIG. 7 represent the gate-source voltage of the MOS transistor 122 and the gate-source voltage of the MOS transistor 121, respectively. The sixth row and the bottom row of FIG. 7 represent which of the on-state and the off-state is assumed by the MOS transistor 120 and the MOS transistor 119.

As in the p-channel case, when the voltage IN− decreases at time t12', the voltage decrease of the voltage IN− is added between the gate and the source of the MOS transistor 122. Furthermore, when the voltage IN− further decreases at time t16', the decreased amount of the voltage IN− is added between the gate and the source of the MOS transistor 122.

When the decreased amount of the voltage IN− applied to the low potential input terminal 102b is larger than the threshold of the MOS transistor 122, the MOS transistor 122 subsequently fails to be turned off. This results in stopping the operation of the level shift circuit.

As in the portion of the level shift circuit composed of the p-channel MOS transistors, a current charging or discharging the gate-source capacitance of the MOS transistors 120, 121 flows at time t12'-t18'. However, the gate-source voltage of the MOS transistors 120, 121 cannot exceed the threshold voltage of the MOS transistors 120, 121. Thus, the MOS transistors 120, 121 fail to be turned on.

Thus, in the level shift circuit 100 of the comparative example, the MOS transistors 113, 114 fail to be turned off by the voltage applied to the high potential input terminal 102a and the low potential input terminal 102b. Accordingly, the operation of the level shift circuit cannot be continued stably.

In contrast, the level shift circuit 1 of this embodiment includes the fifth to eighth MOS transistors 15-18. Thus, the increase of the voltage IN+ of the high potential input terminal 2a can be detected by the threshold voltage of one of the MOS transistors. In the level shift circuit 1, the increase of the voltage IN+ can be detected to charge the third capacitance element 33 and the fourth capacitance element 34 by the fifth to eighth MOS transistors 15-18. In the level shift circuit 1, the increased amount of the voltage IN+ can be detected using the threshold voltage of the fifth to eighth MOS transistors 15-18 to stop charging the third capacitance element 33 and the fourth capacitance element 34. Preferably, the fifth to eighth MOS transistors 15-18 have an equal transistor size. Thus, the value of the current charging the third capacitance element 33 and the fourth capacitance element can be made nearly equal. The increased amount of the voltage across the third capacitance element 33 and the fourth capacitance element 34 can be made equal by setting the third capacitance element 33 and the fourth capacitance element 34 to an equal capacitance. Thus, the voltage across the third capacitance element 33 and the fourth capacitance element 34 can be made equal to the voltage added with the increased amount of the voltage IN+.

The level shift circuit 1 of this embodiment includes the thirteenth to sixteenth MOS transistors 23-26. Thus, the decrease of the voltage IN− of the low potential input terminal 2b can be detected by the threshold voltage of the MOS transistors. In the level shift circuit 1, the decrease of the voltage IN− can be detected to charge the seventh capacitance element 37 and the eighth capacitance element 38 by the thirteenth to sixteenth MOS transistors 23-26. In the level shift circuit 1, the decreased amount of the voltage IN− can be detected using the threshold voltage of the thirteenth to sixteenth MOS transistors 23-26 to stop charging the seventh capacitance element 37 and the eighth capacitance element 38. Preferably, the thirteenth to sixteenth MOS transistors 23-26 have an equal transistor size. Thus, the value of the current charging the seventh capacitance element 37 and the eighth capacitance element 38 can be made nearly equal. The increased amount of the voltage across the seventh capacitance element 37 and the eighth capacitance element 38 can be made equal by setting the seventh capacitance element 37 and the eighth capacitance element 38 to an equal capacitance. Thus, the voltage across the seventh capacitance element 37 and the eighth capacitance element 38 can be made equal to the voltage added with the decreased amount of the voltage IN−.

Thus, the level shift circuit 1 of this embodiment includes the fifth to eighth MOS transistors 15-18 and the thirteenth to sixteenth MOS transistors 23-26. Thus, the voltage across the third capacitance element 33, the fourth capacitance element 34, the seventh capacitance element 37, and the eighth capacitance element 38 can be reset to an appropriate value depending on the voltage IN+, IN−. In the level shift circuit 1, the voltage across the third capacitance element 33, the fourth capacitance element 34, the seventh capacitance element 37, and the eighth capacitance element 38 is constantly set to an appropriate value. Thus, the third MOS transistor 13, the fourth MOS transistor 14, the eleventh MOS transistor 21, and the twelfth MOS transistor 22 can be appropriately turned off in response to the signals φ1-φ4. Accordingly, the level shift circuit 1 can stably continue operation.

Second Embodiment

Figure 8:
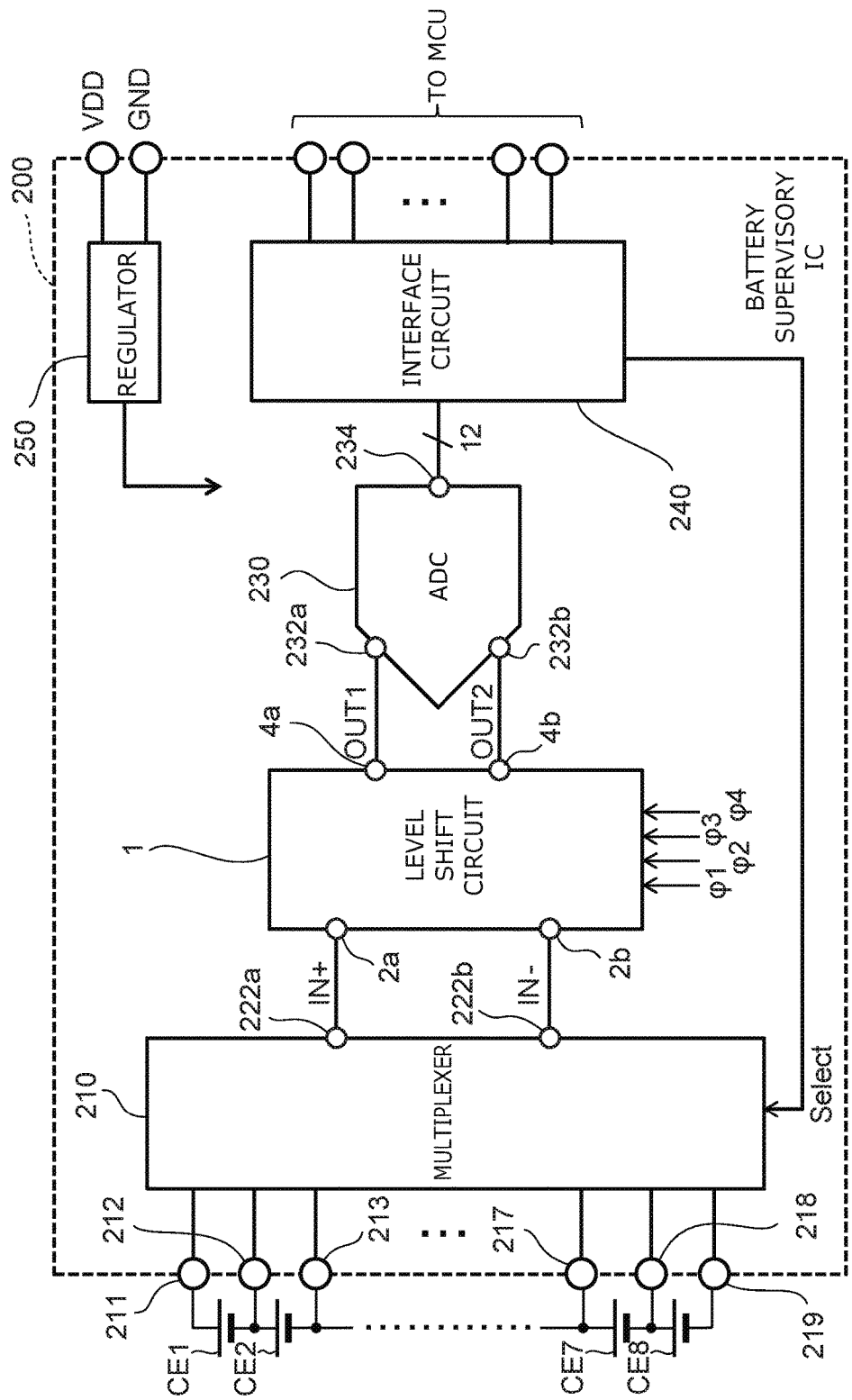
FIG. 8 is a block diagram illustrating a battery supervisory IC (battery supervisory circuit) according to a second embodiment.

The level shift circuit 1 of the first embodiment can be used in a semiconductor device for detecting the voltage of each of series-connected battery cells by switching between the battery cells, FIG. 8 is a block diagram illustrating a battery supervisory IC (battery supervisory circuit) 200 according to this embodiment.

As shown in FIG. 8, the battery supervisory IC 200 of this embodiment includes a level shift circuit 1, a multiplexer 210, and an analog-digital converter 230. The battery supervisory IC 200 may include an interface circuit 240 and a regulator 250. The battery supervisory IC 200 receives input by switching connection to each terminal voltage of series-connected battery cells CE1, CE2, ..., CE7, CE8 and converts it to digital signals for output. The analog-digital converter 230 outputs a digitally converted value of the detected voltage of the battery cell. The interface circuit 240 converts the digitally converted value into a form communicable with an external circuit such as a microcontroller unit (hereinafter referred to as MCU) for output. Furthermore, the interface circuit 240 receives a command from the MCU and converts it to data in an appropriate form. The regulator 250 generates power supply to be supplied to e.g. the interface circuit 240, and the signal generator 44 and the buffer circuit 42 of the level shift circuit 1.

The level shift circuit 1 is the level shift circuit of the above first embodiment. The level shift circuit 1 receives a voltage IN+ as a high potential input and a voltage IN− as a low potential input from the multiplexer 210. The level shift circuit 1 converts the amplitude of signals φ1-φ4 to output signals OUT1, OUT2 having an amplitude between the voltage IN+ and the voltage IN−. The output signals OUT1, OUT2 are inputted to the analog-digital converter 230.

The multiplexer 210 includes input terminals 211, 212, 213, ..., 217, 218, 219 and output terminals 222a, 222b. The input terminals 211, 212, 213, ..., 217, 218, 219 are connected with the respective electrodes of series-connected battery cells CE1, CE2, ..., CE7, CE8. In this example, the multiplexer 210 is connected to each of eight battery cells connected in series. For instance, the input terminal 211 is connected to the positive electrode of the battery cell CE1 at the highest potential of the series-connected battery cells. The input terminal 212 is connected to the negative electrode of the battery cell CE1. The input terminal 212 is connected to the positive electrode of the battery cell CE2 series-connected to the battery cell CE1. The input terminal 213 is connected to the negative electrode of the battery cell CE2. The input terminal 218 is connected to the positive electrode of the battery cell CE8 at the lowest potential. The input terminal 219 is connected to the negative electrode of the battery cell CE8. The input terminal 217 is connected to the positive electrode of the battery cell CE7 series-connected to the battery cell CE8. The input terminal 218 is connected to the negative electrode of the battery cell CE7. The output terminal 222a and the output terminal 222b are connected to the high potential input terminal 2a and the low potential input terminal 2b of the level shift circuit 1, respectively.

The multiplexer 210 is supplied with a select signal Select from the external MCU through the interface circuit 240. The multiplexer 210 connects two input terminals selected by the inputted select signal Select to the two output terminals 222a, 222b. For instance, when the input terminal 211 and the input terminal 212 are selected by the select signal Select, the input terminal 211 is connected to the output terminal 222a, and the input terminal 212 is connected to the output terminal 222b. That is, the positive electrode of the battery cell CE1 is connected to the high potential input terminal 2a of the level shift circuit 1. The negative electrode of the battery cell CE1 is connected to the low potential input terminal 2b of the level shift circuit 1. When the input terminal 212 and the input terminal 213 are selected, the positive electrode of the battery cell CE2 is connected to the high potential input terminal 2a of the level shift circuit 1 through the output terminal 222a. The negative electrode of the battery cell CE2 is connected to the low potential input terminal 2b of the level shift circuit 1 through the output terminal 222b.

The analog-digital converter 230 includes two input terminals 232a, 232b. The signal inputted to the two input terminals 232a, 232b is an analog differential signal. The analog-digital converter 230 includes a plurality of output terminals 234. The number of output terminals 234 is determined by the number of bits with which the inputted analog data is converted to digital data. This number of bits represents the resolution of the analog-digital converter 230. In this example, the resolution of the analog-digital converter 230 is 12 bits, and the number of output terminals 234 is at least twelve. The analog-digital converter 230 includes e.g. an analog-digital conversion section of the $\Delta\Sigma$ type. The input terminals 232a, 232b of the analog-digital converter 230 are connected to the output terminals 4a, 4b of the level shift circuit 1, respectively. The analog-digital converter 230 receives as input the differential output signal OUT1, OUT2 outputted from the level shift circuit 1 and converts it to 12-bit parallel digital data for output. The parallel digital data outputted from the analog-digital converter 230 is converted to serial data in an appropriate form by the interface circuit 240 and transmitted to the external MCU.

The operation of the battery supervisory IC 200 of this embodiment is now described.

In the battery supervisory IC 200 of this embodiment, the electrodes of the series-connected battery cells CE1, CE2, . . . , CE7, CE8 are connected to the input terminals 211-219 of the multiplexer 210. The multiplexer 210 selects two input terminals to be selected from the input terminals 211-219 based on the select signal Select. Thus, the multiplexer 210 connects the electrodes of one of the battery cells CE1, CE2, . . . , CE7, CE8 to the output terminals 222a, 222b.

The level shift circuit 1 receives input of the signal $\phi1$-$\phi4$ having an amplitude of 0-5 V. The level shift circuit 1 converts the amplitude of the signal $\phi1$-$\phi4$ to the amplitude between the voltage IN− applied to the low potential input terminal 2b and the voltage IN+ applied to the high potential input terminal 2a for output. The level shift circuit 1 outputs level-shifted output signals OUT1, OUT2 as a differential output signal. For instance, the battery cell is a lithium-ion battery with a nominal voltage of 3.6 V. In this case, when the battery cell CE1 is selected, the voltage IN+ is 28.8 V, and the voltage IN− is 25.2 V.

The analog-digital converter 230 receives as input the output signal OUT1, OUT2 outputted from the level shift circuit 1 and converts it to digital data. The output signal OUT1, OUT2 is a differential signal. Thus, the difference between OUT1 and OUT2 is the voltage between the electrodes of the selected battery cell. Then, the obtained digital data is transmitted to the MCU through the interface circuit 240. The voltage data of the battery cell connected to the input terminals 211, 212 is calculated in the MCU.

After the voltage data of one battery cell is obtained, the select signal Select inputted to the multiplexer 210 is changed in order to obtain the voltage data of another battery cell. The multiplexer 210 switches connection between the input terminal and the output terminal in accordance with the changed select signal Select. For instance, when the selection is changed from the battery cell CE1 to the battery cell CE2, the voltage IN+ inputted to the high potential input terminal 2a of the level shift circuit 1 changes from 28.8 V to 25.2 V, and the voltage IN− inputted to the low potential input terminal 2b changes from 25.2 V to 21.6 V. Thus, the battery supervisory IC 200 obtains the voltage of each of a plurality of series-connected battery cells by switching between the battery cells. The battery supervisory IC 200 converts the voltage to digital data for output.

The function and effect of the battery supervisory IC 200 of this embodiment are now described.

The battery supervisory IC 200 of this embodiment obtains the voltage data of one battery cell. Then, the battery supervisory IC 200 switches the connection of the multiplexer 210 in order to obtain the voltage data of another battery cell. The level shift circuit 1 continuously receives input of signals $\phi1$-$\phi4$. Thus, the voltage IN+, IN− inputted to the level shift circuit 1 is switched independently of the phase of the signals $\phi1$-$\phi4$.

For instance, after the multiplexer 210 selects the input terminals 211, 212, the select signal Select is switched, and the multiplexer 210 selects the input terminals 212, 213. Then, the multiplexer 210 outputs a voltage decreased by the voltage of one battery cell. In the case where the battery cell is a lithium-ion battery, the two outputs from the multiplexer 210 are each switched to a voltage decreased by approximately 3.6 V. For instance, when the connection to the input terminals 218, 219 is switched to the connection to the input terminals 217, 218, the two outputs of the multiplexer 210 are each switched to a voltage increased by approximately 3.6 V. That is, the voltage IN− applied to the low potential input terminal 2b of the level shift circuit 1 may decrease in steps of approximately 3.6 V, or a voltage value of an integer multiple of 3.6 V. The voltage IN+ applied to the high potential input terminal 2a of the level shift circuit 1 may increase in steps of approximately 3.6 V, or a voltage value of an integer multiple of 3.6 V.

As described in the first embodiment, the level shift circuit 1 includes the fifth to eighth MOS transistors 15-18 and the thirteenth to sixteenth MOS transistors 23-26. Thus, the level shift circuit 1 can reliably perform the level shift operation even in the case of the change of the voltage IN+, IN− as described above. Accordingly, the battery supervisory IC 200 can obtain the voltage of each of series-connected battery cells without any limitation by switching connection to the battery cells.

Third Embodiment

Figure 9:
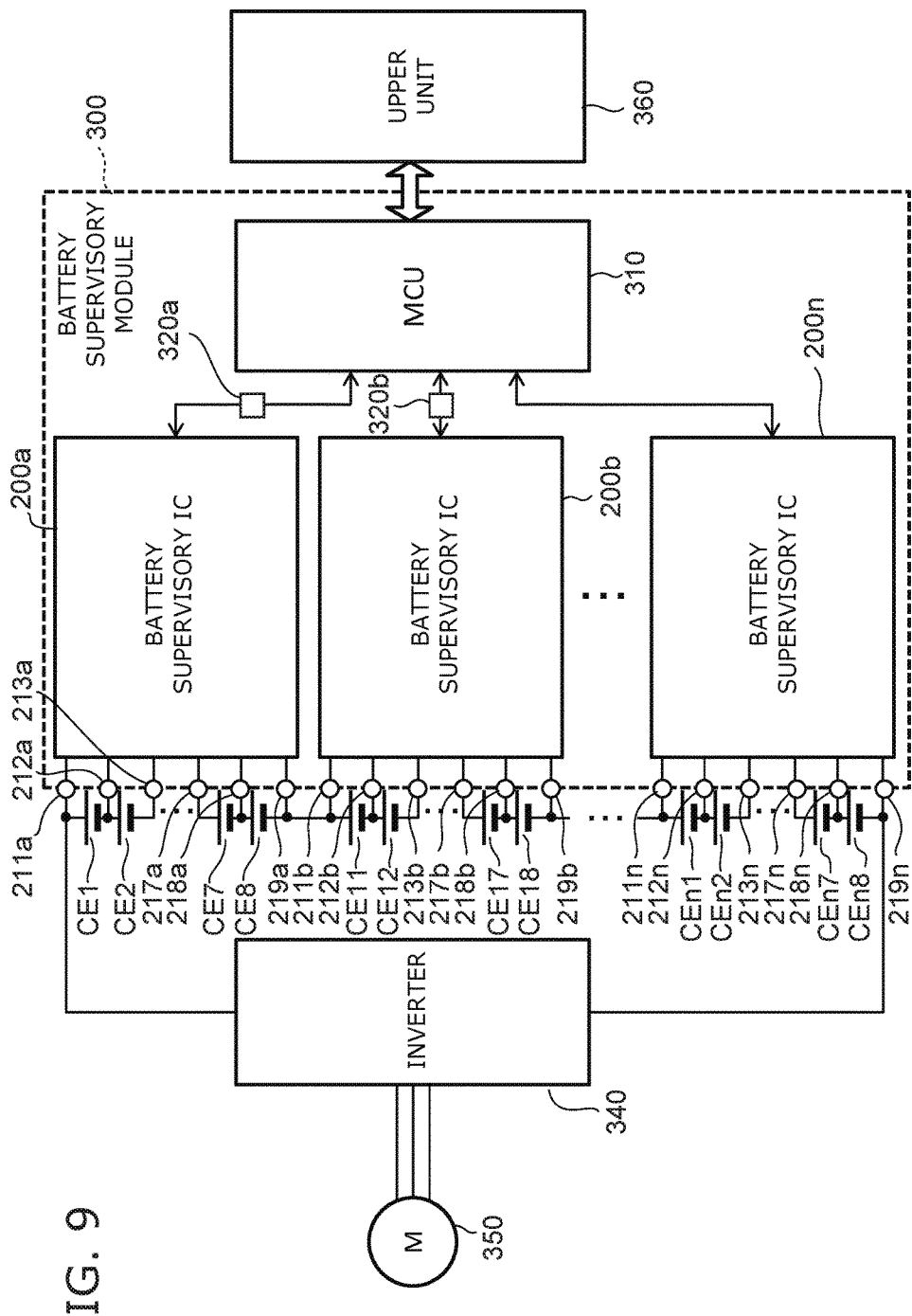
FIG. 9 is a block diagram illustrating a battery supervisory module according to a third embodiment.

FIG. 9 is a block diagram illustrating a battery supervisory module 300 according to this embodiment.

As shown in FIG. 9, the battery supervisory module 300 of this embodiment includes battery supervisory ICs 200a-200n and an MCU 310. The battery supervisory module 300 includes a plurality of input terminals 211a-219n. The positive electrode and the negative electrode of a battery cell are connected between two input terminals. The battery supervisory module 300 is connected to an upper unit 360 through the interface circuit of the MCU. The upper unit 360 is e.g. a traveling control device of an electric vehicle. The battery supervisory module 300 calculates the battery remaining capacity based on the voltage of the battery cell. The upper unit 360 specifies a traveling condition depending on the calculated battery remaining capacity. The battery supervisory module 300 is used to supervise the voltage of each battery cell in a series-connected battery pack used in e.g. an electric vehicle, a hybrid car, or a fuel cell car. The battery pack supervised by the battery supervisory module 300 drives an electric motor 350 through an inverter 340.

The battery pack may include 100 or more battery cells connected in series. In this example, the 100 or more battery cells connected in series are divided in sets of eight battery cells. Thus, the battery supervisory ICs 200a, 200b, . . . , 200n are used for each set to measure the voltage of the respective battery cells. The battery supervisory ICs 200a, 200b, . . . , 200n are provided in cascode for the respective sets of eight battery cells along the series-connected battery cells. In the case where the battery supervisory ICs 200a, 200b, . . . , 200n are connected in cascode, the ground potential with the processing circuit such as the MCU 310 is different therebetween. Thus, a signal transmission circuit 320a, 320b, . . . needs to be provided between the battery supervisory IC 200a, 200b, . . . and the MCU 310. The signal transmission circuit 320a, 320b, . . . is a circuit for electrically insulating the input and output and transmitting signals by magnetic or optical coupling. The signal transmission circuit 320a, 320b, . . . is e.g. a transformer or a photocoupler.

The series-connected battery cells CE1-CE8 are connected to the battery supervisory IC 200a. The series-connected battery cells CE11-CE18 are connected to the battery supervisory IC 200b. The other series-connected battery cells CEn1-CEn8 are similarly connected to the battery supervisory IC 200n.

The digital data concerning the battery cell obtained by the battery supervisory ICs 200a, 200b, . . . , 200n is processed by the MCU 310 as voltage data of the electrode of each battery cell.

The battery supervisory module 300 of this embodiment includes the battery supervisory ICs 200a, 200b, . . . , 200n including the level shift circuit 1 described above. Thus, the battery supervisory module 300 can stably perform the level shift operation without stopping the operation even when the voltage is measured by selecting one of the series-connected battery cells and then selecting another battery cell.

The embodiments described above can realize a level shift circuit, a semiconductor device, and a battery supervisory device capable of dynamically, statically, or continuously converting the voltage level of an input signal to a plurality of voltage levels.

In the descriptions for several embodiments of the invention, the embodiments are proposed as examples and are not intended to limit the scope of the invention. The newly proposed embodiments can be executed in other various forms and can be subjected to various types of omission, replacement, and changes without departing from the spirit of the invention. The embodiments and the variations thereof are included within the scope and the spirit of the invention and are included within a scope which is equivalent to the invention disclosed in Claims.

What is claimed is:

1. A level shift circuit comprising:
a first transistor of a first conductivity type connected by one main electrode to a first input terminal and connected by another main electrode to a first output terminal, the first input terminal being capable to input a first input potential;
a second transistor of the first conductivity type connected by one main electrode to the first input terminal and connected by another main electrode to a second output terminal;
a third transistor of the first conductivity type connected by one main electrode to the first input terminal and connected by another main electrode to a first control electrode that is a control electrode of the first transistor;
a fourth transistor of the first conductivity type connected by one main electrode to the first input terminal and connected by another main electrode to a second control electrode that is a control electrode of the second transistor;
a fifth transistor of the first conductivity type connected by one main electrode to the first input terminal;
a sixth transistor of the first conductivity type including a sixth control electrode connected to a fifth control electrode that is a control electrode of the fifth transistor and connected to one of a third control electrode that is a control electrode of the third transistor and a fourth control electrode that is a control electrode of the fourth transistor, the sixth transistor being connected by one main electrode to the first input terminal;
a seventh transistor of the first conductivity type connected by one main electrode to the other main electrode of the fifth transistor and connected by the other main electrode to the third control electrode;
an eighth transistor of the first conductivity type including an eighth control electrode connected to a seventh control electrode that is a control electrode of the seventh transistor and connected to the other of the third control electrode and the fourth control electrode, the eighth transistor being connected by one main electrode to another main electrode of the sixth transistor and connected by another main electrode to the fourth control electrode;
a first capacitance element connected by one electrode to a first signal input terminal and connected by another electrode to the first control electrode;
a second capacitance element connected by one electrode to a second signal input terminal and connected by another electrode to the second control electrode;

a third capacitance element connected by one electrode to the first signal input terminal and connected by another electrode to the fourth control electrode; and a fourth capacitance element connected by one electrode to the second signal input terminal and connected by another electrode to the third control electrode.

2. The circuit according to claim 1, wherein
the fifth transistor and the sixth transistor have an equal transistor size, and
the seventh transistor and the eighth transistor have an equal transistor size.

3. The circuit according to claim 2, wherein one of the fifth transistor and the sixth transistor on one hand and the seventh transistor and the eighth transistor on the other is on, and the other is off, and both are turned on by input of a different potential as the first input potential.

4. The circuit according to claim 3, wherein when all the fifth transistor, the sixth transistor, the seventh transistor, and the eighth transistor are turned on, the fourth capacitance element is charged through the fifth transistor and the seventh transistor, and the third capacitance element is charged through the sixth transistor and the eighth transistor.

5. The circuit according to claim 1, further comprising:
a ninth transistor of a second conductivity type connected by one main electrode to a second input terminal and connected by another main electrode to the first output terminal, the second input potential being capable to input a second input potential lower than the first input potential;
a tenth transistor of the second conductivity type connected by one main electrode to the second input terminal and connected by another main electrode to the second output terminal;
an eleventh transistor of the second conductivity type connected by one main electrode to the second input terminal and connected by another main electrode to a ninth control electrode that is a control electrode of the ninth transistor;
a twelfth transistor of the second conductivity type connected by one main electrode to the second input terminal and connected by another main electrode to a tenth control electrode that is a control electrode of the tenth transistor;
a thirteenth transistor of the second conductivity type connected by one main electrode to the second input terminal
a fourteenth transistor of the second conductivity type including a fourteenth control electrode connected to a thirteenth control electrode that is a control electrode of the thirteenth transistor and connected to one of an eleventh control electrode that is a control electrode of the eleventh transistor and a twelfth control electrode that is a control electrode of the twelfth transistor, the fourteenth transistor being connected by one main electrode to the second input terminal;
a fifteenth transistor of the second conductivity type connected by one main electrode to another main electrode of the thirteenth transistor and connected by another main electrode to the eleventh control electrode;
a sixteenth transistor of the second conductivity type including a sixteenth control electrode connected to a fifteenth control electrode that is a control electrode of the fifteenth transistor and another of the eleventh control electrode and the twelfth control electrode, the sixteenth transistor being connected by one main electrode to another main electrode of the fourteenth transistor and connected by another main electrode to the twelfth control electrode;

a fifth capacitance element connected by one electrode to a third signal input terminal and connected by another electrode to the ninth control electrode;

a sixth capacitance element connected by one electrode to a fourth signal input terminal and connected by another electrode to the tenth control electrode;

a seventh capacitance element connected by one electrode to the third signal input terminal and connected by another electrode to the twelfth control electrode; and an eighth capacitance element connected by one electrode to the fourth signal input terminal and connected by another electrode to the eleventh control electrode.

6. The circuit according to claim 5, wherein
the thirteenth transistor and the fourteenth transistor have an equal transistor size, and
the fifteenth transistor and the sixteenth transistor have an equal transistor size.

7. The circuit according to claim 5, wherein one of the thirteenth transistor and the fourteenth transistor on one hand and the fifteenth transistor and the sixteenth transistor on the other is on, and the other is off, and both are turned on by change of the second input potential.

8. The circuit according to claim 5, wherein when all the thirteenth transistor, the fourteenth transistor, the fifteenth transistor, and the sixteenth transistor are turned on, the fourth capacitance element is charged through the thirteenth transistor and the fifteenth transistor, and the third capacitance element is charged through the fourteenth transistor and the sixteenth transistor.

9. The circuit according to claim 5, wherein
the first transistor and the ninth transistor operate complementarily, and
the ninth transistor and the tenth transistor operate complementarily.

10. The circuit according to claim 5, wherein the first transistor, the second transistor, the ninth transistor, and the tenth transistor have a DMOS structure.

11. A semiconductor device comprising:
a multiplexer connected to a positive electrode and a negative electrode of each of a plurality of series-connected battery cells and configured to selectively output a voltage of each of the battery cells;
a level shift circuit connected to an output of the multiplexer; and
an analog-digital converter connected to an output of the level shift circuit,
the level shift circuit including:
a first transistor of a first conductivity type connected by one main electrode to a first input terminal and connected by another main electrode to a first output terminal, the first input terminal being capable to input a first input potential;
a second transistor of the first conductivity type connected by one main electrode to the first input terminal and connected by another main electrode to a second output terminal;
a third transistor of the first conductivity type connected by one main electrode to the first input terminal and connected by another main electrode to a first control electrode that is a control electrode of the first transistor;
a fourth transistor of the first conductivity type connected by one main electrode to the first input terminal and connected by another main electrode to a second control electrode that is a control electrode of the second transistor;
a fifth transistor of the first conductivity type connected by one main electrode to the first input terminal;
a sixth transistor of the first conductivity type including a sixth control electrode connected to a fifth control electrode that is a control electrode of the fifth transistor and connected to one of a third control electrode that is a control electrode of the third transistor and a fourth control electrode that is a control electrode of the fourth transistor, the sixth transistor being connected by one main electrode to the first input terminal;
a seventh transistor of the first conductivity type connected by one main electrode to the other main electrode of the fifth transistor and connected by the other main electrode to the third control electrode;
an eighth transistor of the first conductivity type including an eighth control electrode connected to a seventh control electrode that is a control electrode of the seventh transistor and connected to the other of the third control electrode and the fourth control electrode, the eighth transistor being connected by one main electrode to another main electrode of the sixth transistor and connected by another main electrode to the fourth control electrode;
a first capacitance element connected by one electrode to a first signal input terminal and connected by another electrode to the first control electrode;
a second capacitance element connected by one electrode to a second signal input terminal and connected by another electrode to the second control electrode;
a third capacitance element connected by one electrode to the first signal input terminal and connected by another electrode to the fourth control electrode; and
a fourth capacitance element connected by one electrode to the second signal input terminal and connected by another electrode to the third control electrode.

12. A battery supervisory apparatus comprising:
a semiconductor device and
a control section connected to the semiconductor device and configured to communicate with the semiconductor device,
the semiconductor device including:
a multiplexer connected to a positive electrode and a negative electrode of each of a plurality of series-connected battery cells and configured to selectively output a voltage of each of the battery cells;
a level shift circuit connected to an output of the multiplexer; and
an analog-digital converter connected to an output of the level shift circuit,
the level shift circuit including:
a first transistor of a first conductivity type connected by one main electrode to a first input terminal and connected by another main electrode to a first output terminal, the first input terminal being capable to input a first input potential;
a second transistor of the first conductivity type connected by one main electrode to the first input terminal and connected by another main electrode to a second output terminal;
a third transistor of the first conductivity type connected by one main electrode to the first input terminal and connected by another main electrode to a first control electrode that is a control electrode of the first transistor;
a fourth transistor of the first conductivity type connected by one main electrode to the first input terminal and connected by another main electrode to a second control electrode that is a control electrode of the second transistor;
a fifth transistor of the first conductivity type connected by one main electrode to the first input terminal;
a sixth transistor of the first conductivity type including a sixth control electrode connected to a fifth control electrode that is a control electrode of the fifth transistor and connected to one of a third control electrode that is a control electrode of the third transistor and a fourth control electrode that is a control electrode of the fourth transistor, the sixth transistor being connected by one main electrode to the first input terminal;
a seventh transistor of the first conductivity type connected by one main electrode to the other main electrode of the fifth transistor and connected by the other main electrode to the third control electrode;
an eighth transistor of the first conductivity type including an eighth control electrode connected to a seventh control electrode that is a control electrode of the seventh transistor and connected to the other of the third control electrode and the fourth control electrode, the eighth transistor being connected by one main electrode to another main electrode of the sixth transistor and connected by another main electrode to the fourth control electrode;
a first capacitance element connected by one electrode to a first signal input terminal and connected by another electrode to the first control electrode;
a second capacitance element connected by one electrode to a second signal input terminal and connected by another electrode to the second control electrode;
a third capacitance element connected by one electrode to the first signal input terminal and connected by another electrode to the fourth control electrode; and
a fourth capacitance element connected by one electrode to the second signal input terminal and connected by another electrode to the third control electrode.

* * * * *